(12) United States Patent
Ide et al.

(10) Patent No.: US 6,907,202 B1
(45) Date of Patent: Jun. 14, 2005

(54) BURST SIGNAL DETECTION CIRCUIT

(75) Inventors: Satoshi Ide, Kawasaki (JP); Shinichi Sakuramoto, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/478,604

(22) Filed: Jan. 6, 2000

(30) Foreign Application Priority Data

Mar. 9, 1999 (JP) .......................................... 11-062290

(51) Int. Cl.$^7$ .......................................... H04B 10/00
(52) U.S. Cl. ..................................... 398/208; 398/210
(58) Field of Search ............................... 359/189–195; 398/202; 250/210

(56) References Cited

U.S. PATENT DOCUMENTS

| | | | |
|---|---|---|---|
| 5,091,920 A | * 2/1992 | Ikeda et al. ................... 327/68 |
| 5,319,191 A | * 6/1994 | Crimmins ................ 250/214 R |
| 5,475,342 A | * 12/1995 | Nakamura et al. .......... 327/309 |
| 5,875,049 A | * 2/1999 | Asano et al. ............ 250/214 A |
| 6,018,407 A | * 1/2000 | Hatakeyama et al. ....... 327/309 |
| 6,038,049 A | * 3/2000 | Shimizu et al. ......... 250/214 A |
| 6,055,279 A | * 4/2000 | Ota ............................. 359/189 |
| 6,115,163 A | * 9/2000 | Nobuhara ................... 359/125 |

* cited by examiner

Primary Examiner—M. R. Sedighian
Assistant Examiner—Agustin Bello
(74) Attorney, Agent, or Firm—Katten Muchin Zavis Rosenman

(57) ABSTRACT

A burst signal detection circuit for detecting the arrival of a burst-like signal, which can accurately detect the burst signal against the DC level variations even in the case where the arriving burst signal is a weak signal, is disclosed. A DC variation removing circuit detects the bottom level of an input signal and removes the DC level variation of the input signal based on the bottom level. An amplitude identifying circuit detects the presence or absence of a burst signal based on the output signal of the DC variation removing circuit. The amplitude identifying circuit includes an amplitude detection circuit for detecting the maximum amplitude of the output signal of the DC variation removing circuit, a threshold level control circuit for controlling the threshold level and a comparator for comparing the output level of the amplitude detection circuit with the threshold level and outputting a detection signal indicating the presence or absence of a burst signal.

7 Claims, 23 Drawing Sheets

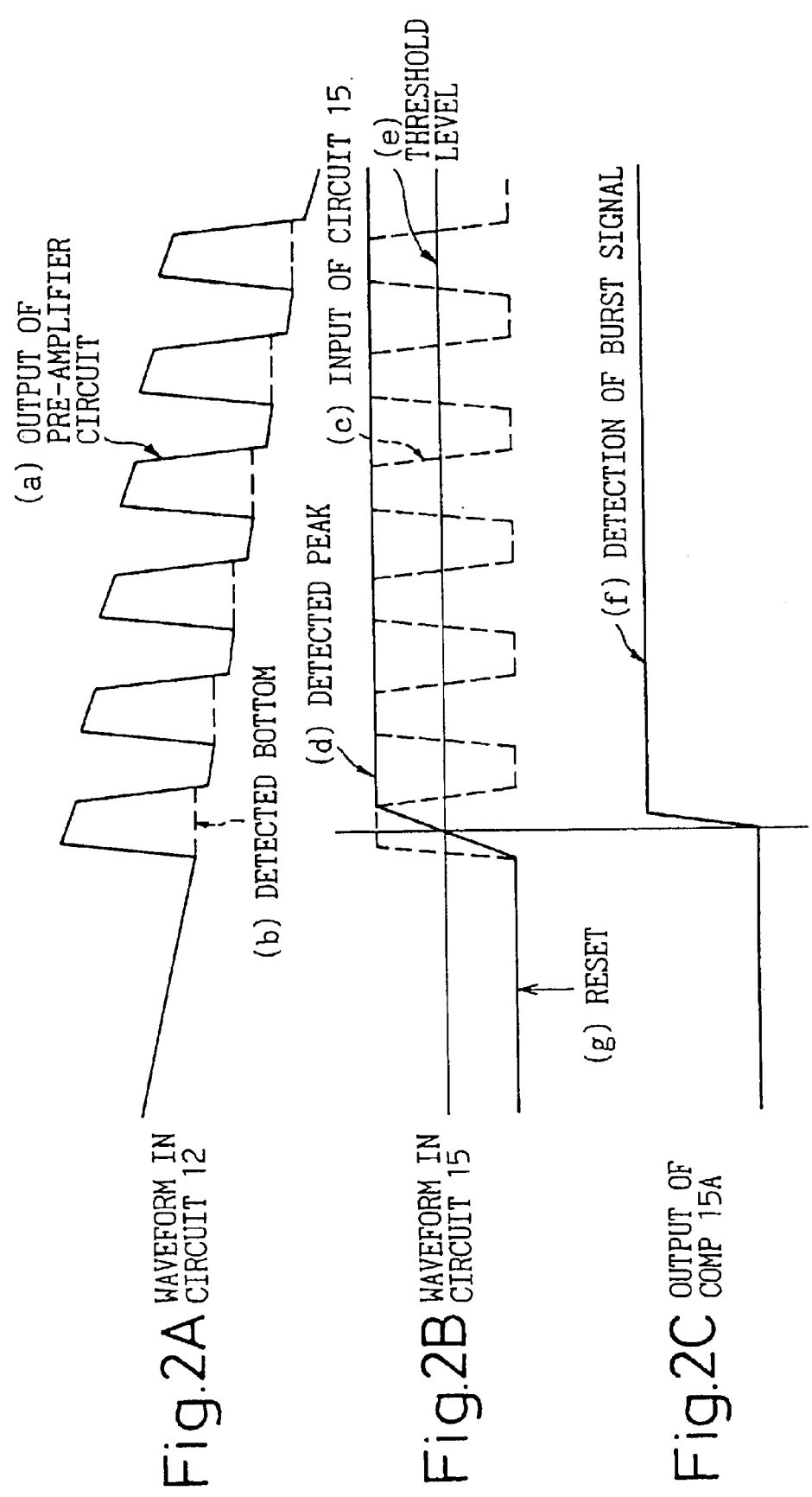

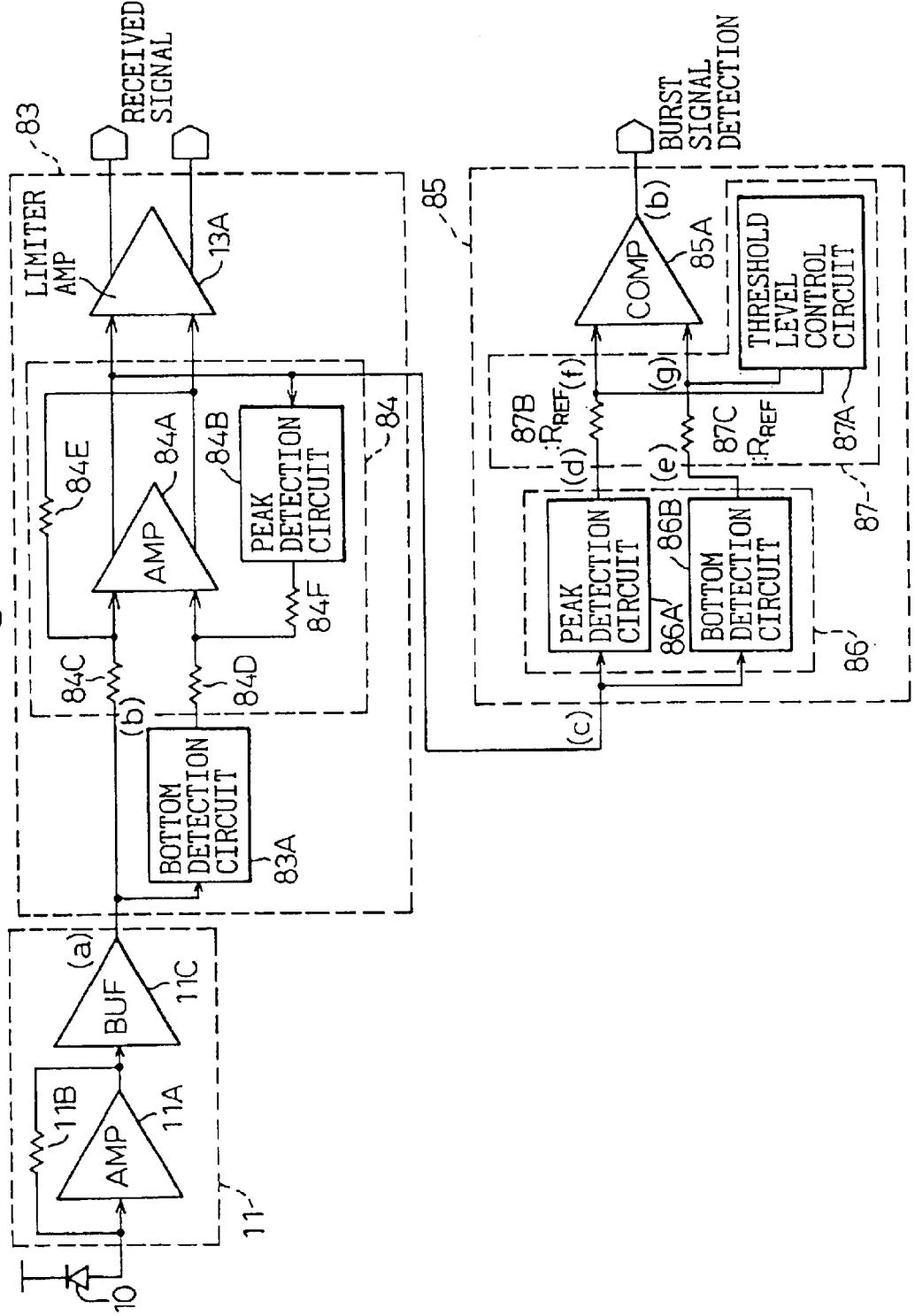

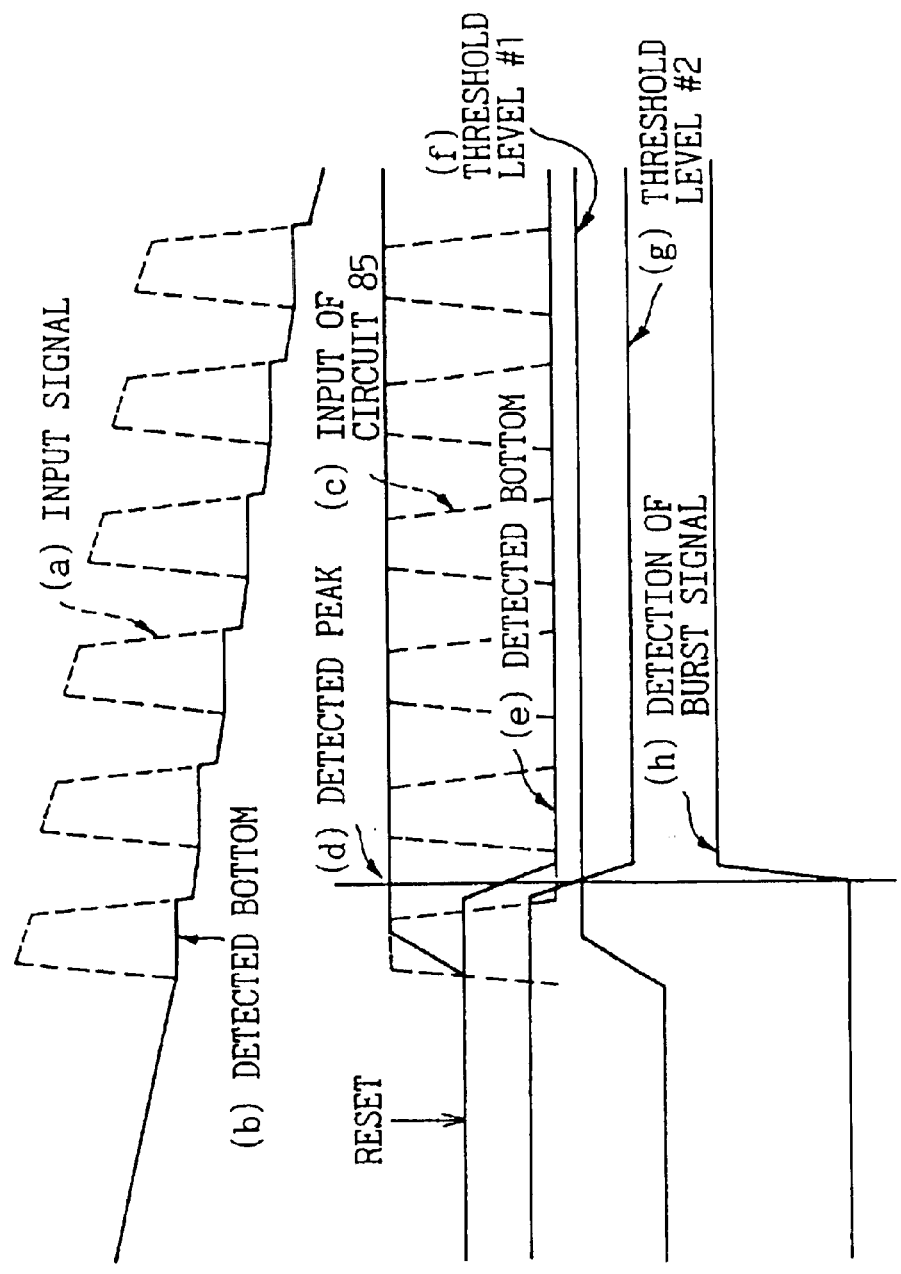

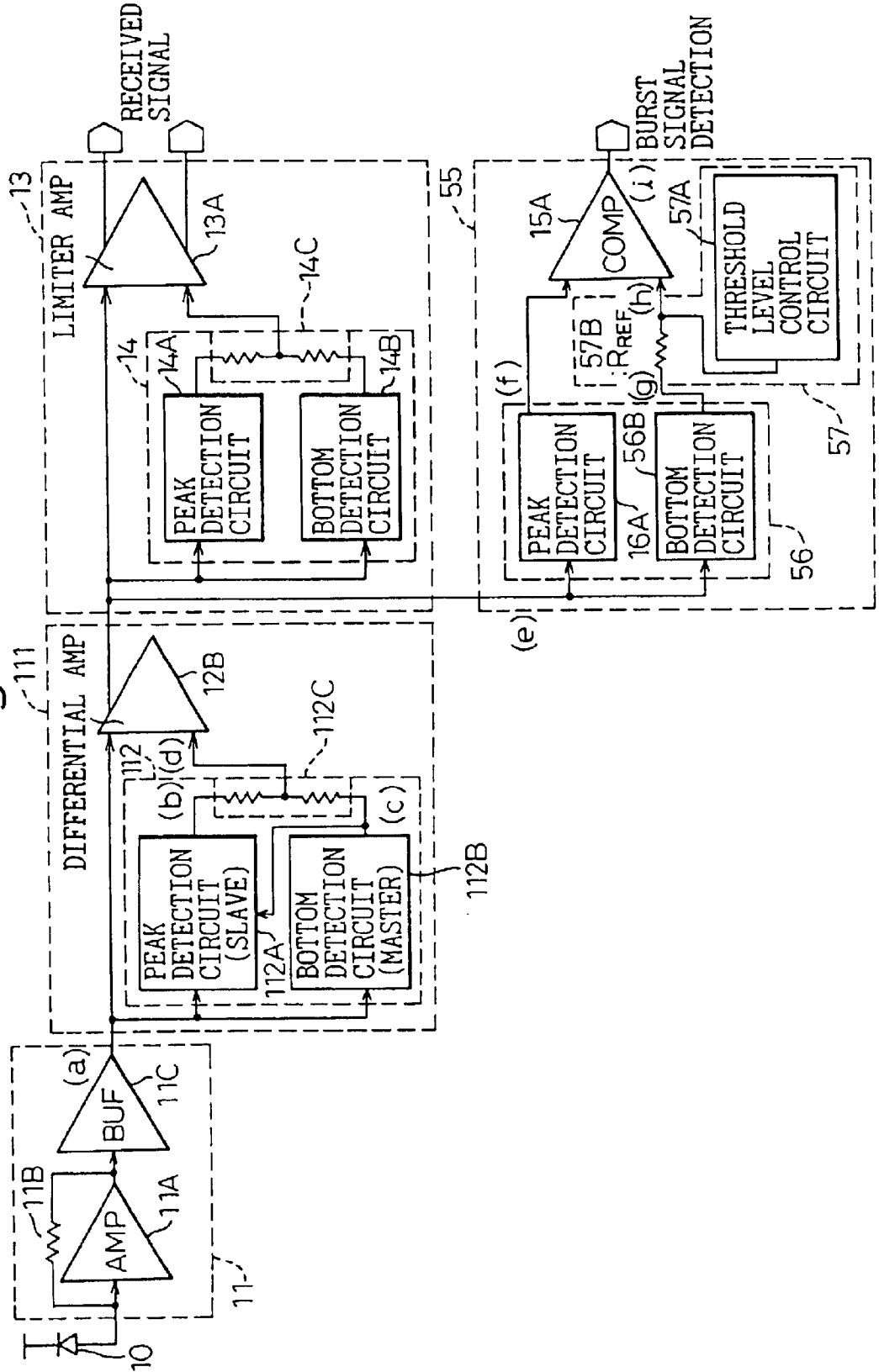

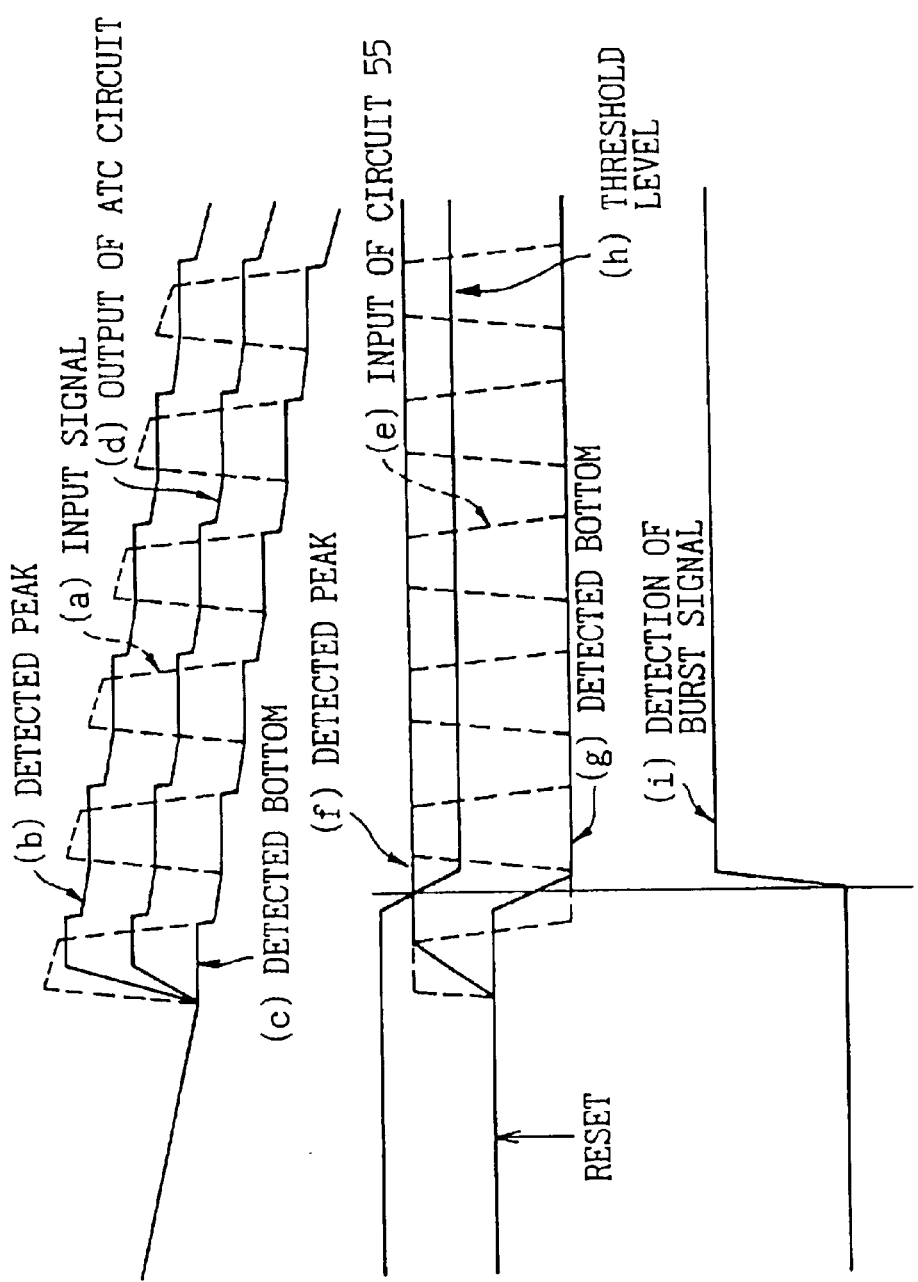

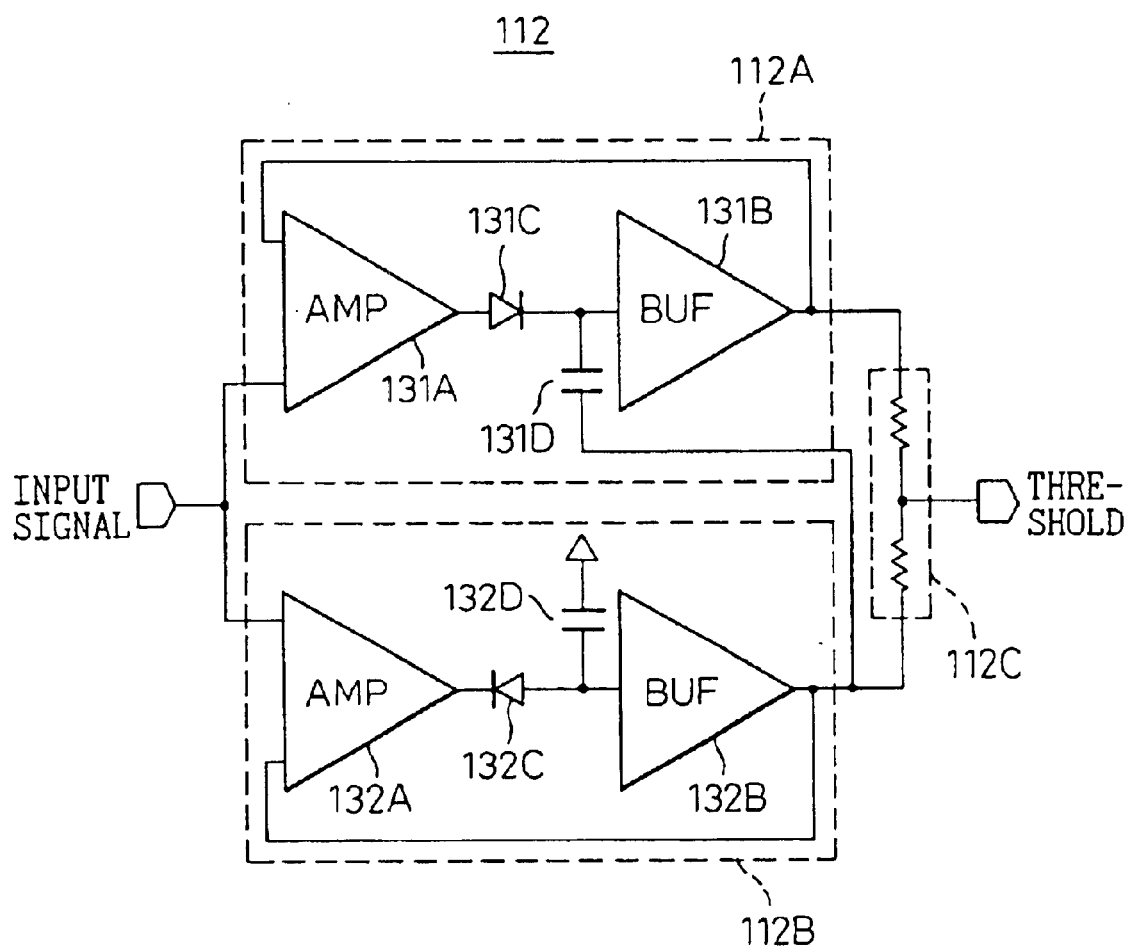

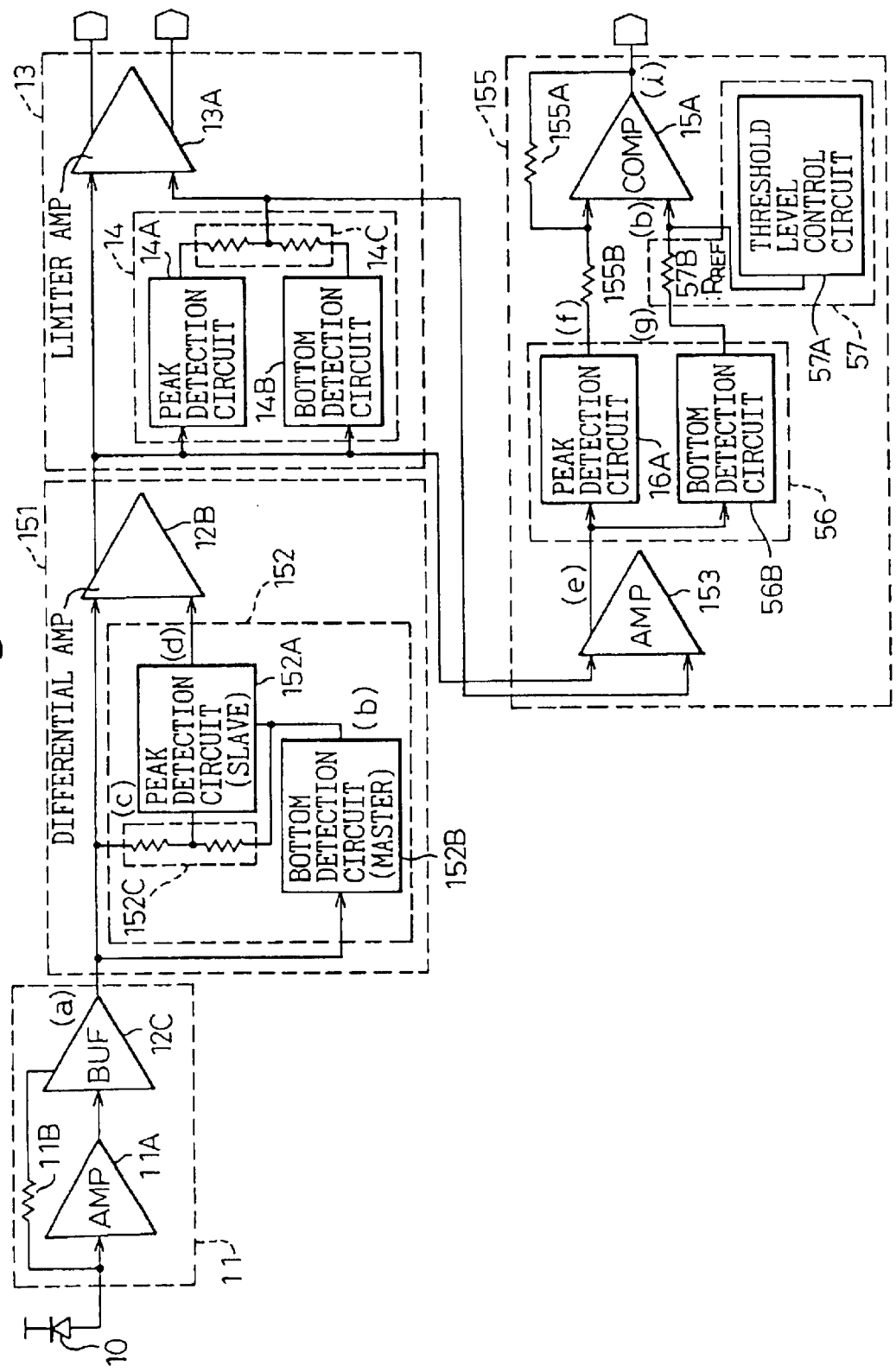

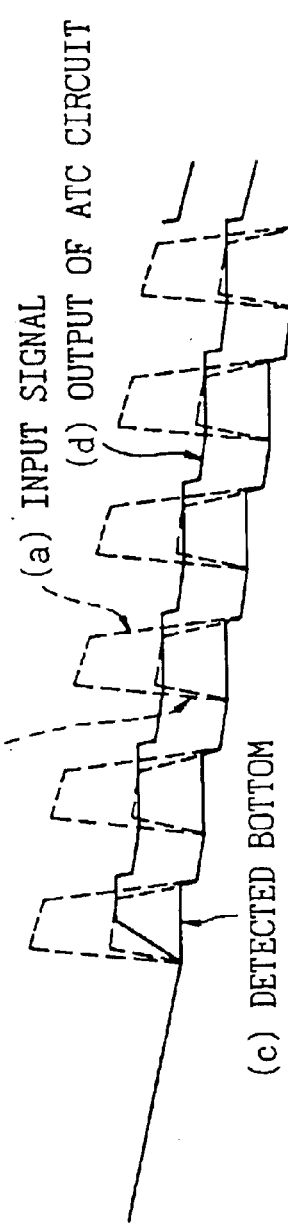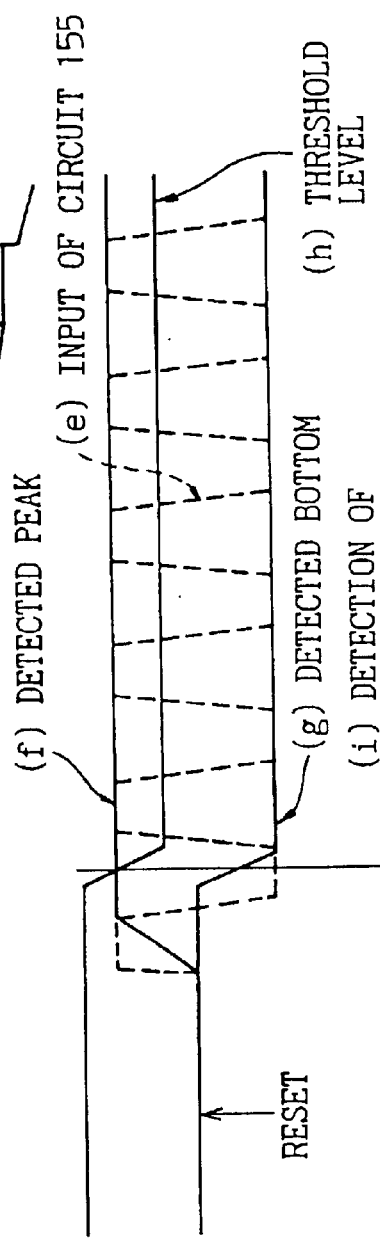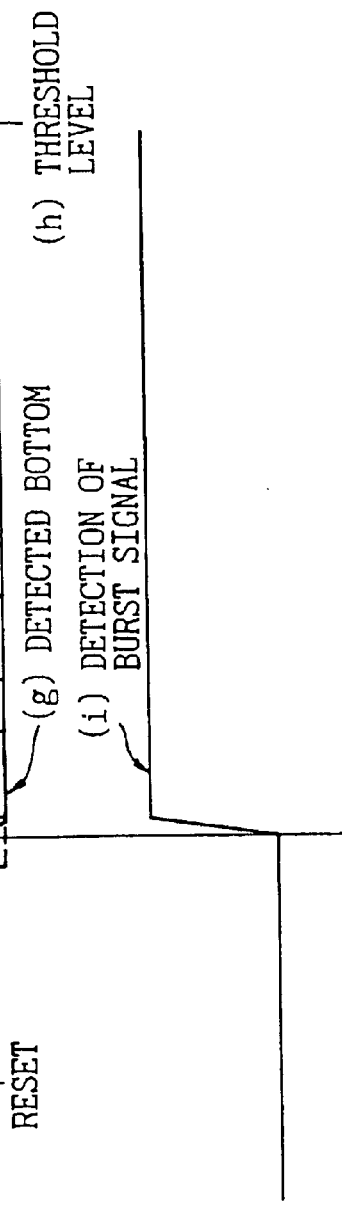

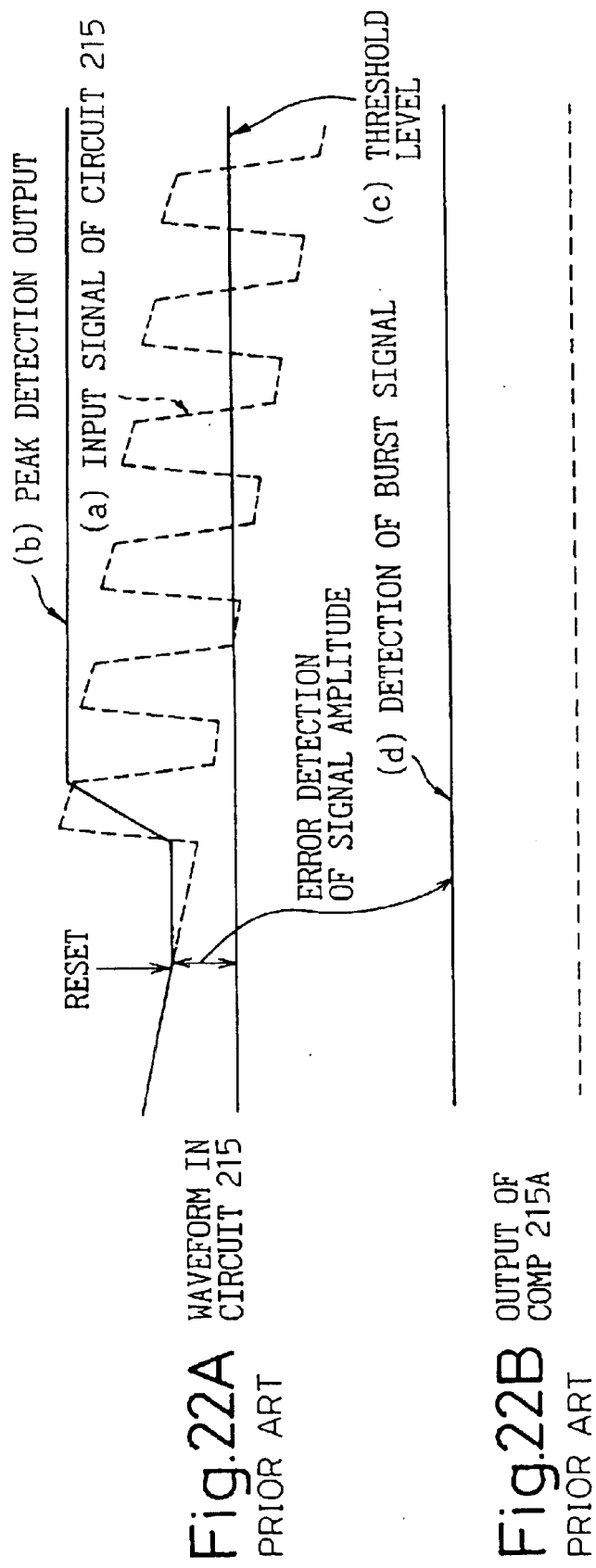

BURST SIGNAL DETECTION CIRCUIT

BACKGROUND OF THE INVENTION

1. Field of the Invention

The present invention relates to a burst signal detection circuit for detecting the arrival of a burst-like signal, and in particular to a burst signal detection circuit used most suitably for a transmission system for transmitting a high-speed optical burst signal in a system such as a passive optical network (PON) system used in a transmission for optical subscriber system.

2. Description of the Related Art

In the transmission of an optical burst signal, the timing of sending out the burst signal to be transmitted is not definitely determined, and therefore a burst signal detecting signal is required to notify the arrival of the burst signal to the transmission system.

For configuring a flexible network system in which each terminal unit for sending out the burst signal can be accommodated at an arbitrary position on the network and a restriction on the transmission distance is relaxed, it is necessary to accurately discriminate the arrival of a weak burst signal from a remote terminal unit on the one hand and the absence of a burst signal on the other hand.

The present invention relates to a burst signal detection circuit for detecting the arrival of a burst signal at a low level accurately without deteriorating the receiving characteristic. In the prior art, the receiving characteristic may be deteriorated by the DC level fluctuation due to the low-frequency response of a photo-diode (PD) for detecting an optical signal.

FIG. 21 shows a configuration of a conventional burst signal detection circuit in a receiver for receiving an optical burst signal. The optical burst signal detection circuit includes a photo-diode (PD) 210 for converting an optical signal into a current signal, a preamplifier 211 for converting the current signal output from the photo-diode (PD) 210 into a voltage signal, a signal amplifier 213 for amplifying a weak signal output from the preamplifier 211 and producing a sufficiently large logic signal, and an amplitude identifying circuit 215 for detecting the presence or absence of a burst signal based on the signal output from the preamplifier 211.

To process the burst signal, the signal amplifier 213 includes an automatic threshold control (ATC) circuit 214 and a buffer amplifier 213A. The input signal from the preamplifier 211 and a threshold level from the automatic threshold control (ATC) circuit 214 are differentially amplified by the buffer amplifier 213A thereby to output a received signal.

The automatic threshold control (ATC) circuit 214 includes a peak detection circuit 214A, a bottom detection circuit 214B, and a voltage dividing circuit 214C. Upon application of a burst signal thereto through the preamplifier 211, the peak detection circuit 214A and the bottom detection circuit 214B instantaneously detect the maximum level and the minimum level, respectively, of the input signal, and the voltage-dividing circuit 214C sets the central level of the amplitude of the input signal providing the voltage-dividing level as a threshold level and outputs it to the buffer amplifier 213A.

In the amplitude identifying circuit 215, a peak detection circuit 216A in an amplitude detection circuit 216 detects the peak level of the input signal from the preamplifier 211, and a comparator 215A compares the input peak level with a threshold level and outputs a burst signal detection signal indicating the presence or absence of the burst signal.

As shown in FIG. 23A, the frequency characteristic of the conversion efficiency of a photodiode (PD) used as an element for receiving the optical signal is known to have a "drop" in the range of several to several hundred kHz and the conversion efficiency increases in the low-frequency region.

This phenomenon is considered to stem from the carriers generated by the optical signal entering the regions other than the light detecting surface of the photo-diode (PD) where an electric field is not applied. The carriers, to which the electric field is not applied, move slowly, by diffusion, and therefore have a very large time constant.

The shoulder of the low-frequency response characteristic is very small and, usually, can be ignored. In the case where burst signals having considerably different amplitudes are input continuously to the photodiode, however, the problem described below arises.

Assuming that, as shown in FIG. 23B, a second burst signal (packet #2) of a small amplitude arrives and is received by the photo-diode (PD) immediately after the end of a first burst signal (packet #1) of a large amplitude at an interval of a short guide time $T_G$, the current output of the photo-diode (PD) responds to a waveform such that, as shown in FIG. 23C, the DC level (bottom level) thereof gradually rises due to the low frequency response at the time of receiving the first burst signal (packet #1) having a large amplitude and the DC level is restored to the original level at the immediately subsequent time after the first burst signal when the second burst signal (packet #2) is received.

The adverse effect of the DC level variation due to the low frequency response depends on the magnitude of the amplitude of the burst signal. That is, the DC level variation is relatively small for the first burst signal (packet #1) having a large amplitude and therefore has no effect on the detection of the burst signal. However, the DC level variation is large and is not negligible for the second burst signal (packet #2) having a small amplitude, and has an adverse effect on the burst signal detection.

FIGS. 22A and 22B show operating waveforms for detecting the burst signal at the time of the leading portion of the second burst signal (packet #2). FIG. 22A shows an input signal (a) of the amplitude identifying circuit 215, a peak detection output (b) of the peak detection circuit 216A, and a threshold level (c) of the threshold level control circuit 217B.

The send-out time length of a burst signal is predetermined. A reset signal is generated during the guard time $T_G$ at predetermined timing, and the peak level of the peak detection circuit 216A is reset by this reset signal.

The input signal (a) shown in FIG. 22A is such that the bottom level output from the photo-diode (PD) is increased by the DC component of the burst signal (packet #1) of a large amplitude that has arrived immediately before. The bottom level of the input signal (a) thus had already exceeded the threshold level (c) at the time of the reset described above. AS shown in FIG. 22B, therefore, the comparator 215B outputs a detection signal (d) erroneously indicating the presence of a burst signal even in the absence of the burst signal.

Specifically, the problem arises in the case where the waveform moves to the low voltage side due to the variation of the bottom level. That is, in this case, while the bottom detection circuit can follow the movement of the waveform, however, the peak detection circuit holds the maximum level of the signal, so that it erroneously detects the amplitude of the input signal as a large amount larger than the actual amplitude. Even in the case where the actual signal is smaller than a specified threshold level or, even worse, in the absence of a signal, a detection signal indicating the presence of the burst signal is erroneously output.

SUMMARY OF THE INVENTION

An object of the present invention is to provide a burst signal detection circuit for detecting a burst signal with high accuracy against the DC level variation attributable to the low frequency response of the photodiode (PD), etc. even in the case where the arriving burst signal is a weak optical signal.

In order to attain the above object, according to the present invention, a DC variation removing circuit is inserted in the stage before detecting the amplitude of the input signal so that the signal input to an amplitude detection circuit develops no DC level variation.

The DC variation removing circuit can be realized by a configuration or a modification thereof in which the output signal of a bottom detection circuit or a peak detection circuit for detecting the DC level variation and the output signal of a preamplifier are differentially amplified.

According to a first aspect of the invention, there is provided a burst signal detection circuit comprising a DC variation removing circuit for detecting the bottom level or the peak level of an input signal and removing the DC level variation of the input signal based on the bottom level or the peak level, and an amplitude identifying circuit for detecting the presence or absence of a burst signal based on the output signal of the DC variation removing circuit, wherein the amplitude signal identifying circuit includes an amplitude detection circuit for detecting the maximum amplitude of the output signal of the DC variation removing circuit, a threshold level control circuit for controlling the threshold level, and a comparator circuit for comparing the output level of the amplitude detection circuit with the threshold level and outputting a detection signal indicating the presence or absence of the burst signal.

According to a second aspect of the invention, there is provided a burst signal detection circuit comprising a DC variation removing circuit for detecting the bottom level or the peak level of the input signal and removing the DC level variation of the input signal based on the bottom level or the peak level, a signal amplifier for amplifying the output signal of the DC variation removing circuit and an amplitude identifying circuit for detecting the presence or absence of the burst signal based on the output signal of the signal amplifier, wherein the amplitude identifying circuit includes an amplitude detection circuit for detecting the maximum amplitude of the output signal of the signal amplifier, an threshold level control circuit for controlling the threshold level, and a comparator circuit for comparing the output level of the amplitude detection circuit with the threshold level and outputting the detection signal indicating the presence or absence of the burst signal.

According to a third aspect of the invention, there is provided a burst signal detection circuit comprising an amplitude detection circuit for detecting the bottom level or the peak level of the input signal and removing the DC level variation of the input signal based on the bottom level or the peak level while at the same time detecting the maximum amplitude of the input signal, a threshold level control circuit for controlling the threshold level, and a comparator circuit for comparing the output level of the amplitude detection circuit with the threshold level and outputting a detection signal indicating the presence or absence of the burst signal.

According to a fourth aspect of the invention, there is provided a burst signal detection circuit comprising a DC variation removing signal amplifier for detecting the bottom level or the peak level of the input signal and removing the DC level variation of the input signal based on the bottom level or the peak level while at the same time amplifying the input signal, and an amplitude identifying circuit for detecting the presence or absence of the burst signal based on the output signal of the DC variation removing signal amplifier, wherein the amplitude identifying circuit includes an amplitude detection circuit for detecting the maximum amplitude of the output signal of the DC variation removing signal amplifier, a threshold level control circuit for controlling the threshold level, and a comparator circuit for comparing the output level of the amplitude detection circuit with the threshold level and outputting a detection signal indicating the presence or absence of the burst signal.

According to a fifth aspect of the invention, there is provided a burst signal detection circuit, wherein the DC variation removing circuit includes a bottom detection circuit or a peak detection circuit for detecting the bottom level or the peak level, respectively, of the input signal and a differential amplifier for differentially amplifying the output signal and the input signal of the bottom detection circuit or the peak detection circuit.

According to a sixth aspect of the invention, there is provided a burst signal detection circuit wherein the DC variation removing circuit includes a bottom detection circuit or a peak detection circuit for detecting the bottom level or the peak level, respectively, of the input signal, a level shift circuit for shifting the output signal of the bottom detection circuit or the peak detection circuit by a predetermined value, and a differential amplifier for differentially amplifying the output signal and the input signal of the level shift circuit.

According to a seventh aspect of the invention, there is provided a burst signal detection circuit, wherein the amplitude detection circuit includes a master-slave type amplitude detection circuit configured with a master bottom detection circuit or a master peak detection circuit for detecting the absolute minimum level or the absolute maximum level, respectively, of the input signal, and a slave peak detection circuit or a slave bottom detection circuit for detecting the relative maximum level or the relative minimum level, respectively, of the input signal from the output level of the master bottom detection circuit or the master peak detection circuit.

According to an eighth aspect of the invention, there is provided a burst signal detection circuit, wherein the master-slave type amplitude detection circuit is so configured that the level-hold capacitor of the slave peak detection circuit or the slave bottom detection circuit is connected to the output of the master bottom detection circuit or the master peak detection circuit.

According to a ninth aspect of the invention, there is provided a burst signal detection circuit, wherein the DC variation removing signal amplifier includes a bottom detection circuit or a peak detection circuit for detecting the DC level variation of the input signal, and an amplifier supplied with the same input signal and the output signal of the bottom detection circuit or the peak detection circuit, and wherein the negative phase output of the amplifier is fed back to the positive phase input of the amplifier through a feedback resistor, and the positive phase output of the amplifier is fed back to the negative phase input of the amplifier through a peak detection circuit and a feedback resistor.

According to a tenth aspect of the invention, there is provided a burst signal detection circuit, wherein the DC variation removing signal amplifier includes a master-slave type automatic threshold control circuit configured with a master bottom detection circuit or a master peak detection circuit for detecting the absolute minimum level or the absolute maximum level, respectively, of the input signal, a slave peak detection circuit or a slave bottom detection circuit for detecting the relative maximum level or the relative minimum level, respectively, of the input signal from the output signal of the master bottom detection circuit or the master peak detection circuit, and a voltage dividing circuit for generating a threshold level by dividing the output signal of the master bottom detection circuit or the master peak detection circuit and the output signal of the slave peak detection circuit or the slave bottom detection circuit.

According to an 11th aspect of the invention, there is provided a burst signal detection circuit, wherein the DC variation removing signal amplifier includes a master-slave type automatic threshold control circuit configured with a master bottom detection circuit or a master peak detection circuit for detecting the absolute minimum level or the absolute maximum level, respectively, of the input signal, a voltage dividing circuit for generating a voltage divided signal by dividing the voltage of the output signal and the input signal of the master bottom detection circuit or the master peak detection circuit, and a slave peak detection circuit or a slave bottom detection circuit for generating a threshold level by detecting the relative maximum level or the relative minimum level, respectively, of the voltage divided signal from the output signal of the master bottom detection circuit or the master peak detection circuit.

According to a 12th aspect of the invention, there is provided a burst signal detection circuit, wherein the master-slave type automatic threshold control circuit connects the level hold capacitor of the slave peak detection circuit or the slave bottom detection circuit to the output of the master bottom detection circuit or the master peak detection circuit.

According to a 13th aspect of the invention, there is provided a burst signal detection circuit, wherein the amplitude identifying circuit includes a peak detection circuit or a bottom detection circuit for detecting the maximum level or the minimum level, respectively, of the input signal, an threshold level control circuit for generating an threshold level, and a comparator circuit for comparing the output level of the peak detection circuit or the bottom detection circuit with the threshold level.

According to a 14th aspect of the invention, there is provided a burst signal detection circuit, wherein the amplitude identifying circuit includes a peak detection circuit and a bottom detection circuit for detecting the maximum level and the minimum level, respectively, of the input signal, a threshold level control circuit for generating an threshold level by shifting the output level of the bottom detection circuit or the peak detection circuit by a predetermined amount, and a comparator circuit for comparing the output level of the peak detection circuit or the bottom detection circuit with the threshold level.

According to a 15th aspect of the invention, there is provided a burst signal detection circuit wherein the amplitude identifying circuit includes a peak detection circuit and a bottom detection circuit for detecting the maximum level and the minimum level, respectively, of the input signal, a threshold level control circuit for producing a first threshold level by shifting the output level of the bottom detection circuit by a predetermined amount and producing a second threshold level by shifting the output level of the peak detection circuit by a predetermined amount, and a comparator circuit for comparing the first threshold level and the second threshold level with each other.

According to a 16th aspect of the invention, there is provided a burst signal detection circuit, wherein the threshold level control circuit includes a temperature compensating circuit for changing the threshold level with a temperature change to thereby compensate for the variation of the gain due to the temperature change.

According to a 17th aspect of the invention, there is provided a burst signal detection circuit, wherein the threshold level control circuit includes a reference voltage circuit for changing the threshold level with the change in the source voltage thereby to compensate for the variation of the gain due to the change in the source voltage.

According to an 18th aspect of the invention, there is provided a burst signal detection circuit, further comprising a photo diode for receiving the optical signal and a preamplifier for converting the current signal output by the photo diode into a voltage signal, wherein the arrival of the burst signal is detected from the output signal of the preamplifier.

BRIEF DESCRIPTION OF THE DRAWINGS

FIGS. 2A–2C are diagrams showing operating waveforms according to the first embodiment of the invention;

FIG. 8 is a diagram showing a configuration according to a fourth embodiment of the invention;

FIGS. 9A–9C are diagrams showing operating waveforms according to the fourth embodiment of the invention;

FIG. 11 is a diagram showing a configuration according to a fifth embodiment of the invention;

FIGS. 12A–12C are diagrams showing operating waveforms according to the fifth embodiment of the invention;

FIG. 13 is a diagram showing a configuration of the master-slave type automatic threshold control (ATC) circuit according to the fifth embodiment of the invention;

FIG. 15 is a diagram showing a configuration according to a sixth embodiment of the invention;

FIGS. 16A–16C are diagrams showing operating waveforms according to the sixth embodiment of the invention;

FIGS. 22A and 22B are diagrams showing operating waveforms for the conventional burst signal detection circuit.

DESCRIPTION OF THE PREFERRED EMBODIMENTS

Figure 1:
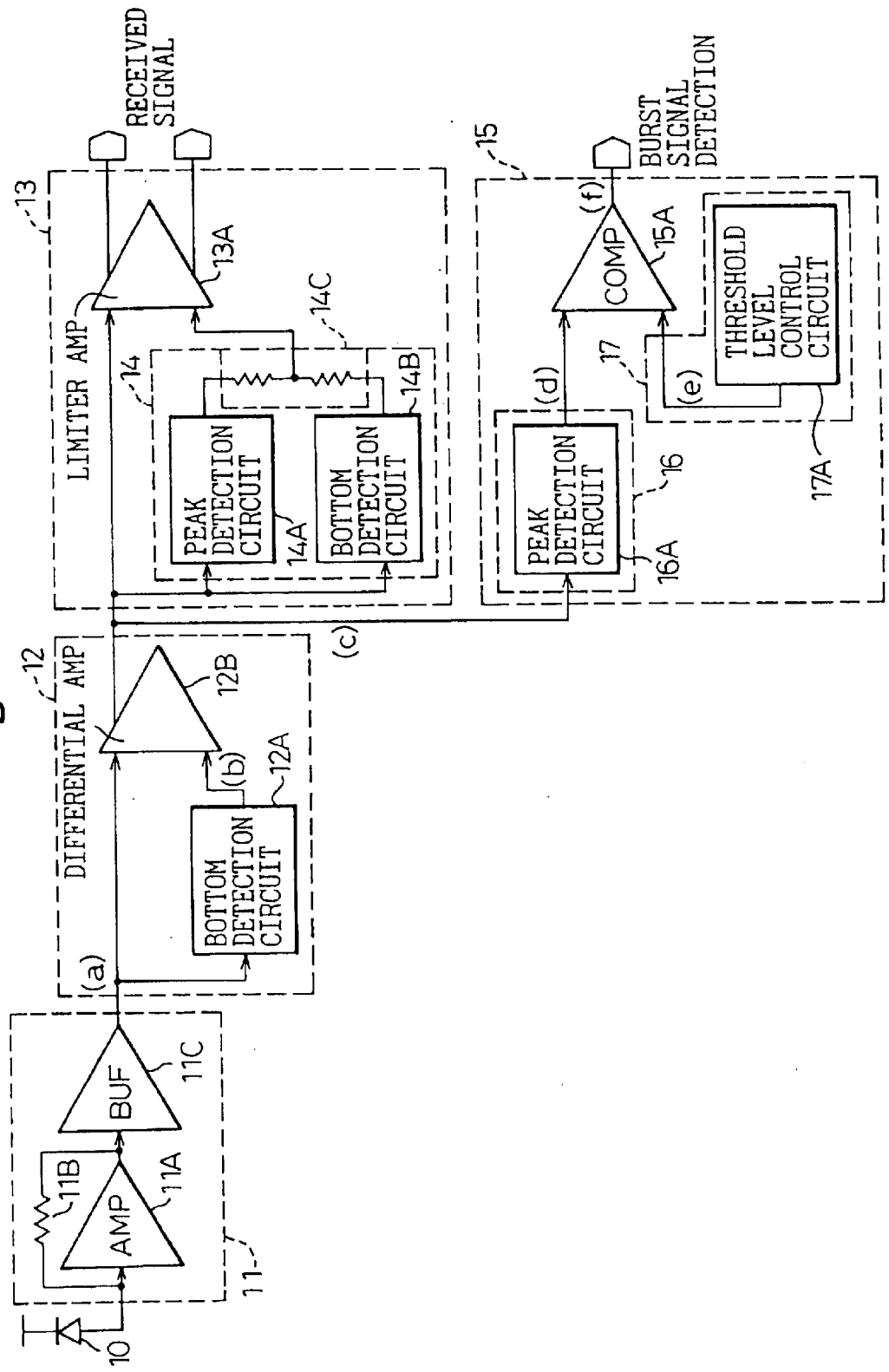
FIG. 1 is a diagram showing a configuration according to a first embodiment of the invention.

FIG. 1 shows a configuration of a first embodiment of the invention. FIGS. 2A to 2C show operating waveforms of the same embodiment. In FIG. 1, a burst signal detection circuit for an optical burst signal receiver is shown. In the figure, reference numeral 10 designates a photo-diode (PD), numeral 11 a preamplifier, numeral 12 a DC variation removing circuit, numeral 13 a signal amplifier, numeral 14 an automatic threshold control (ATC) circuit, numeral 15 an amplitude identifying circuit, numeral 16 an amplitude detection circuit and numeral 17 a identifying circuit.

The photo-diode (PD) 10 converts the arriving optical signal into a current signal, and the preamplifier 11 converts the current signal output from the photo-diode (PD) 10 into a voltage signal by means of an amplifier 11A, a resistor 11B and an inverting buffer amplifier 11C.

The DC variation removing circuit 12 applies the output signal of the preamplifier 11 to the bottom detection circuit 12A and the differential amplifier 12B. The bottom detection circuit 12A detects and outputs the bottom level of the output signal of the preamplifier 11 including the DC level variation, and differentially amplifies the output signal of the preamplifier 11 and the bottom level by means of the differential amplifier 12B. Thus, a signal is output in which the DC level variation is removed.

The differential amplifier 12B is set to have a low gain in order to reduce the waveform distortion due to the output saturation and thus operates as a buffer. The differential amplifier 12B can of course be designed with any gain to operate other than as a buffer.

The signal amplifier 13 amplifies the weak signal output from the preamplifier 11 to thereby produce a sufficiently large logic signal. The signal amplifier 13 includes an automatic threshold control (ATC) circuit 14 and a limiter amplifier 13A to meet the requirement of the burst-like signal.

The automatic threshold control (ATC) circuit 14 includes a peak detection circuit 14A, a bottom detection circuit 14B and a voltage dividing circuit 14C. Upon application of a burst signal thereto, the peak detection circuit 14A and the bottom detection circuit 14B instantaneously detect and output a maximum value and a minimum value, respectively of the input signal. The voltage dividing circuit 14C, on the other hand, divides the voltage of the maxim and minimum levels output from the peak detection circuit 14A and the bottom detection circuit 14B by a resistor, and sets the threshold level to the central level of the input signal.

The signal amplifier 13 applies the threshold level set by the voltage dividing circuit 14C and the input signal from the DC variation removing circuit 12 to the limiter amplifier 13A and, even when the burst signals have small levels, amplifies and outputs the received signal at a predetermined amplitude level.

The amplitude identifying circuit 15 is supplied with the signal from which the DC level variation is removed by the DC variation removing circuit 12, and the peak level thereof is detected by the peak detection circuit 16A of the amplitude detection circuit 16. The particular peak level and the threshold level output from the threshold level control circuit 17A of the identifying circuit 17 are applied to a comparator 15A. The comparator 15A outputs a detection signal indicating the presence or absence of a burst signal in accordance with whether the peak level has exceeded the threshold level or not.

FIGS. 2A to 2C show an example of the operating waveforms according to the embodiment shown in FIG. 1, wherein FIG. 2A shows a waveform in the DC variation removing circuit 12; FIG. 2B shows a waveform in each circuit in the amplitude identifying circuit 15, and FIG. 2C shows a waveform of the output from the comparator 15A in the amplitude identifying circuit 15.

Figure 23A:
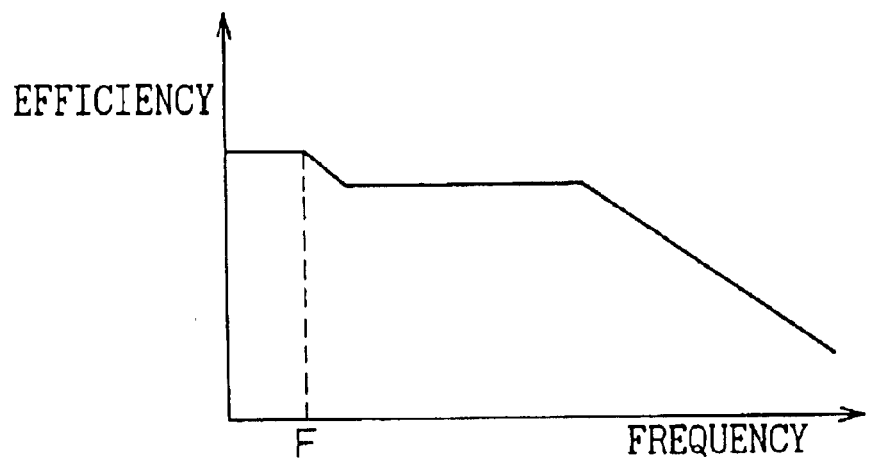
FIGS. 23A–23C are diagrams for explaining the frequency response of a light-receiving element and the DC level variation of the burst signal.
Figure 23B:
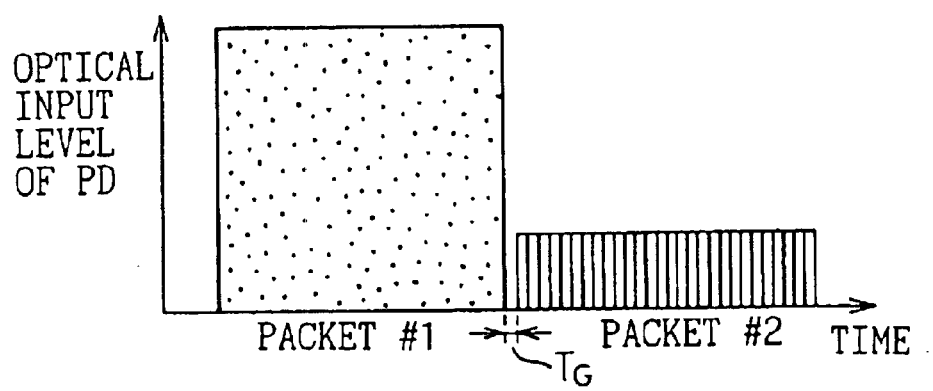
Figure 23C:
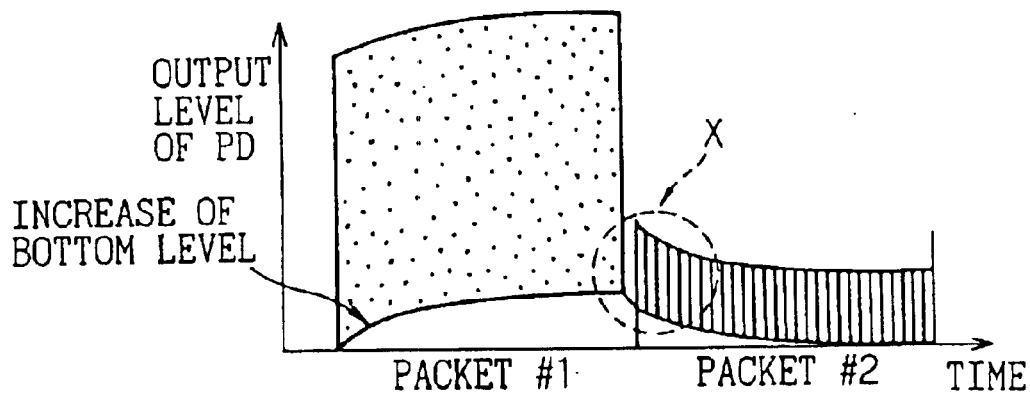

The examples of the operating waveforms shown in FIGS. 2A to 2C represent the waveforms of a burst signal (packet #2), similar to that shown in FIG. 23, having a small amplitude arriving immediately after a burst signal (packet #1) of a large amplitude. The DC variation removing circuit 12 is supplied with an output signal (a) indicated by solid line in FIG. 2A from the preamplifier 11, and the bottom detection circuit 12A of the DC variation removing circuit 12 outputs the bottom level (b) indicated by the dotted line in FIG. 2A.

The amplitude identifying circuit 15 is supplied with a signal (c) indicated by the dotted line in FIG. 2B from the DC variation removing circuit 12, and the peak detection circuit 16A in the amplitude identifying circuit 15 outputs a detected peak level (d) indicated by solid line in FIG. 2B.

The detected peak level output from the peak detection circuit 16A is reset within a guard time. The reset signal (g) in FIG. 2B is generated at a predetermined timing within the guard time, and the peak detection level is reset by this reset signal (g). This is also the case with the peak detection circuit 14A and the bottom detection circuits 12A and 14B in the other circuits.

When the detected peak level (d) exceeds the threshold level (e) (FIG. 2B), the comparator 15A in the amplitude identifying circuit 15 outputs a detection signal (f) indicating the presence of a burst signal as shown in FIG. 2C.

As described above, according to the invention, before detecting the amplitude by the amplitude identifying circuit 15, the DC level variation is removed by the DC variation removing circuit 12. Therefore, the burst signal can be accurately detected regardless of the variation of the DC level due to the low frequency response of the photo-diode (PD), etc.

Figure 3A:
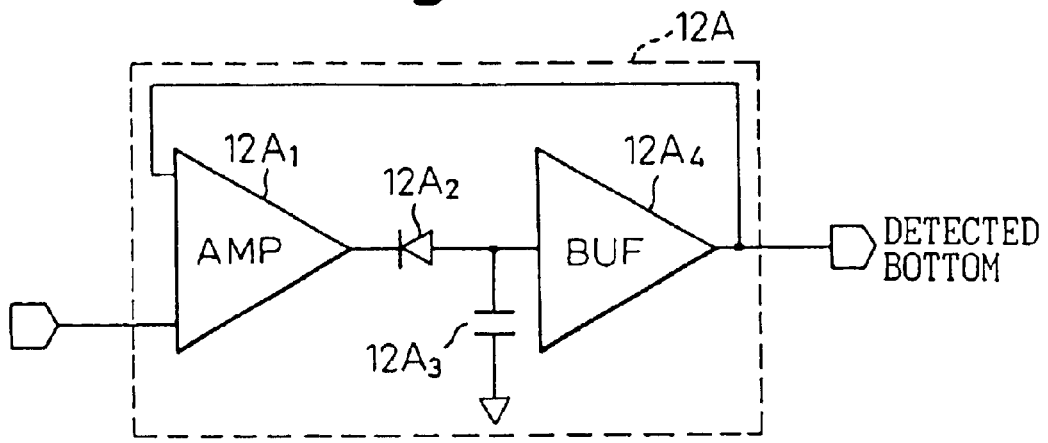
FIGS. 3A and 3B are diagrams showing a configuration of the bottom detection circuit and the threshold level control circuit according to the first embodiment of the invention.

The bottom detection circuit 12A in the DC variation removing circuit 12, as shown in FIG. 3A, for example, can be configured with an amplifier $12A_1$, a diode $12A_2$, a capacitor $12A_3$ and a buffer amplifier $12A_4$.

Figure 3B:
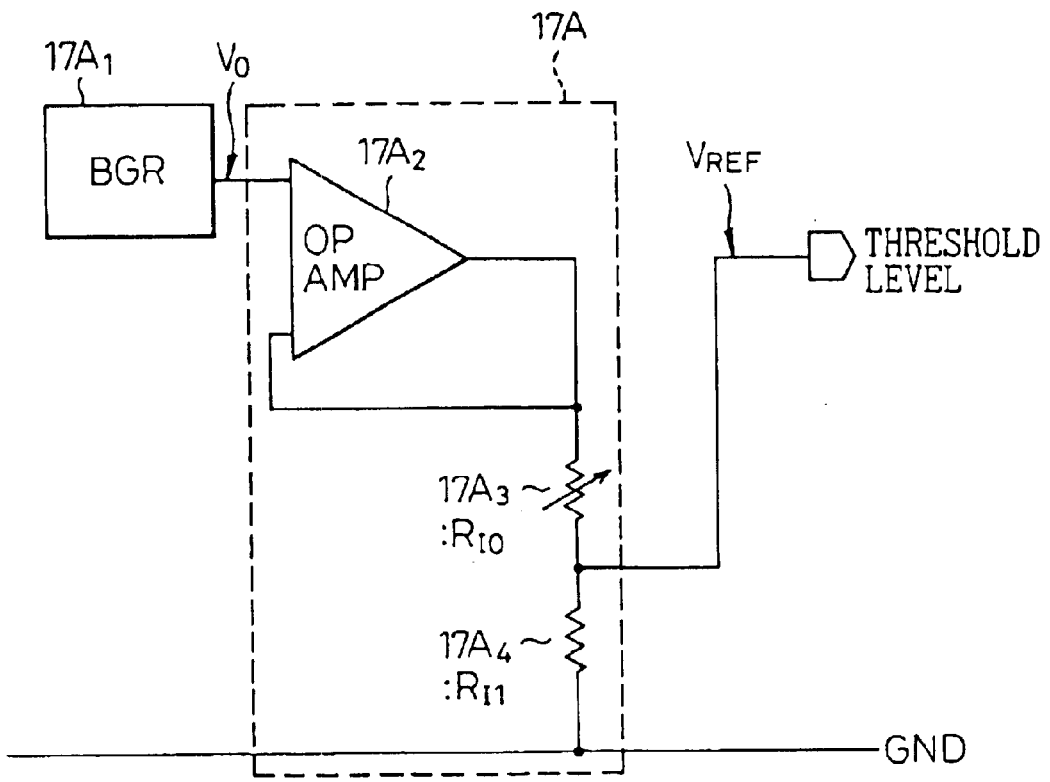

The threshold level control circuit 17A, on the other hand, can be configured, as shown in FIG. 3B for example, with a reference voltage source (BGR: band gap reference) $17A_1$, an operational amplifier $17A_2$, and resistors $17A_3$ and $17A_4$.

Assume that the reference voltage output from the reference voltage source (BGR) $17A_1$ is $V_O$ and the resistance values of the resistors $17A_3$ and $17A_4$ are $R_{f0}$ and $R_{f1}$. The threshold level $V_{REF}$ output from the threshold level control circuit 17A is given by equation (1) below.

$$V_{REF} = \{R_{f1}/(R_{f0}+R_{f1})\} * V_O \quad (1)$$

By changing the voltage dividing ratio of the resistance values $R_{f0}$ and $R_{f1}$, the threshold level can be adjusted.

The threshold level control circuit 17A can of course assume various configurations other than the example configuration shown in FIG. 3B. In the embodiments described below also, the invention can assume various configurations modified based on the modification of the basic configuration thereof.

Figure 4:
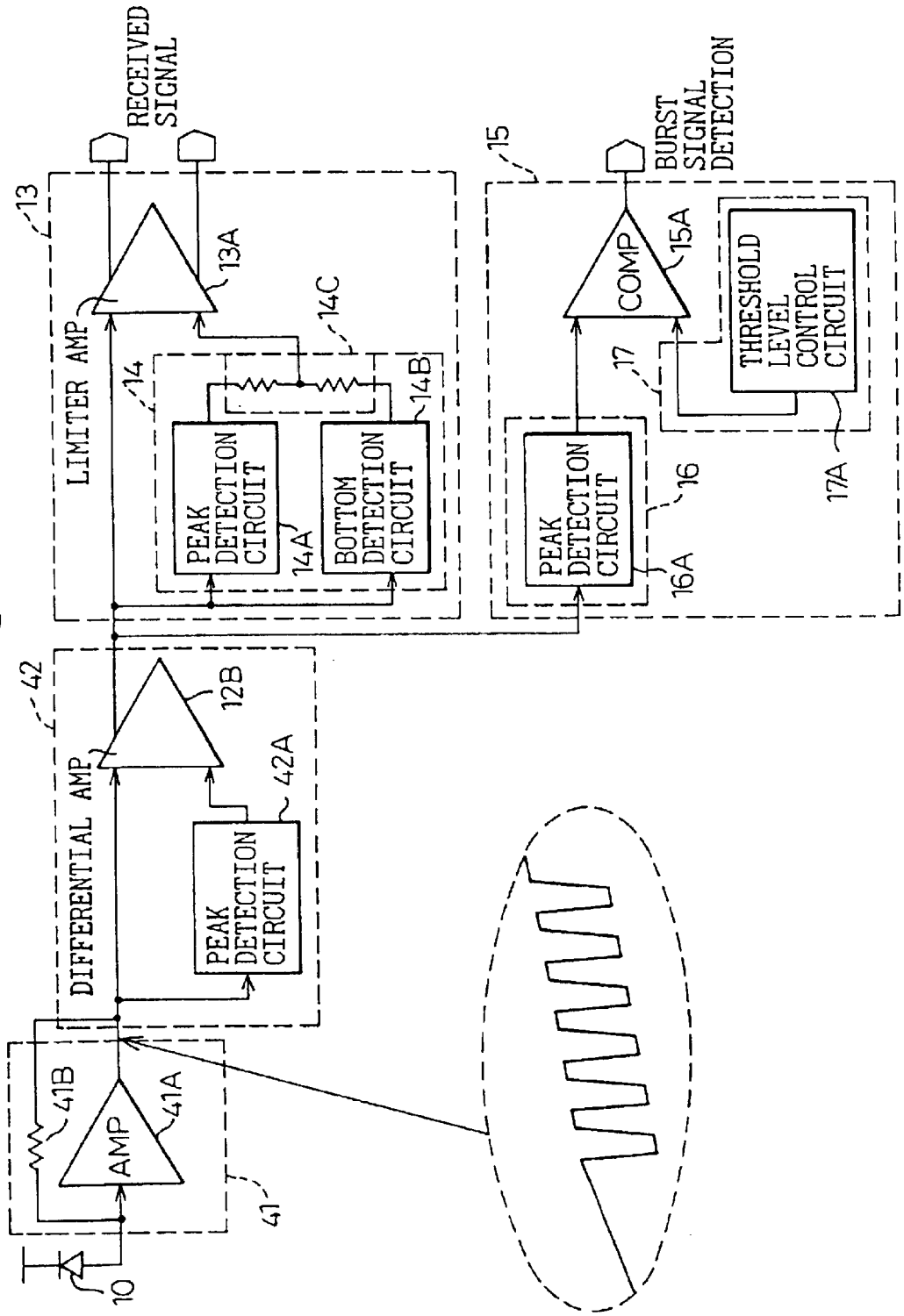
FIG. 4 is a diagram showing a configuration according to a second embodiment of the invention.

FIG. 4 is a diagram showing a configuration according to a second embodiment of the invention. According to the second embodiment, in place of the preamplifier 11 in the first embodiment described above, a preamplifier 41 is configured with one amplifier 41A and a resistor 41B. As a result, the signal output from the preamplifier 41 is inverted in polarity as compared with the first embodiment.

Thus, according to the second embodiment, the bottom detection circuit 12A of the DC variation removing circuit 12 in the first embodiment is replaced with a peak detection circuit 42A to detect the DC level variation.

Specifically, in the DC variation removing circuit 42, the differential amplifier 12B differentially amplifies the output signal of the peak detection circuit 42A for detecting the DC level variation and the output signal of the preamplifier 41 thereby to remove the DC level variation component from the output signal of the preamplifier 41.

The other parts of the configuration remain the same as the first embodiment, and like in the first embodiment, the presence or absence of a burst signal can be accurately detected from the signal of which the DC variation is removed. In FIG. 4, the same component elements as the corresponding ones in the first embodiment are designated by the same reference numerals, respectively and will not be described again.

In the other embodiments described below also, as in the first embodiment described above, components with an inverted input signal polarity can make up a configuration with inverted logic. The operating principle, however, remains similar and will not be explained again.

Figure 5:
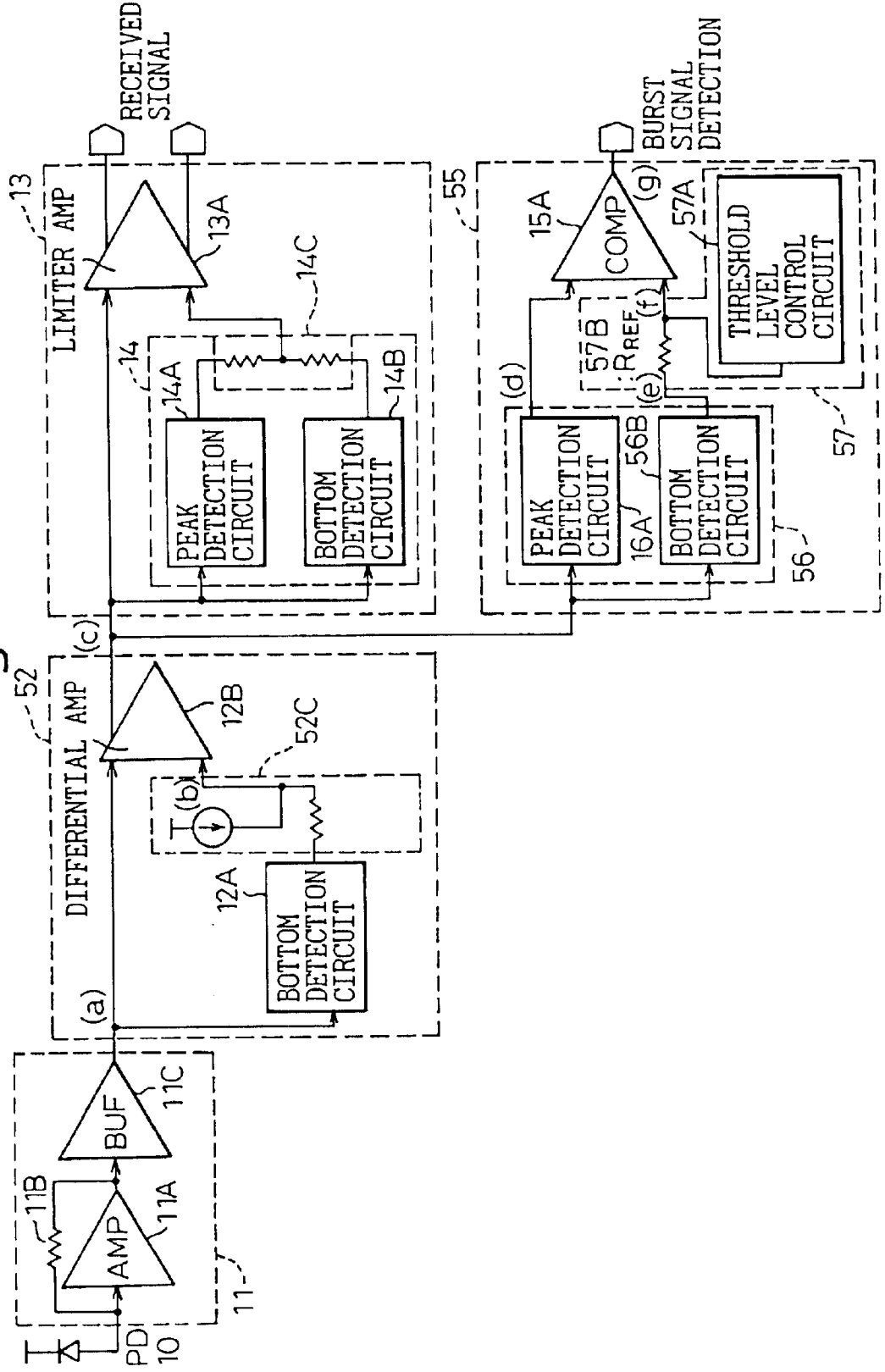
FIG. 5 is a diagram showing a configuration according to a third embodiment of the invention.
Figure 6:
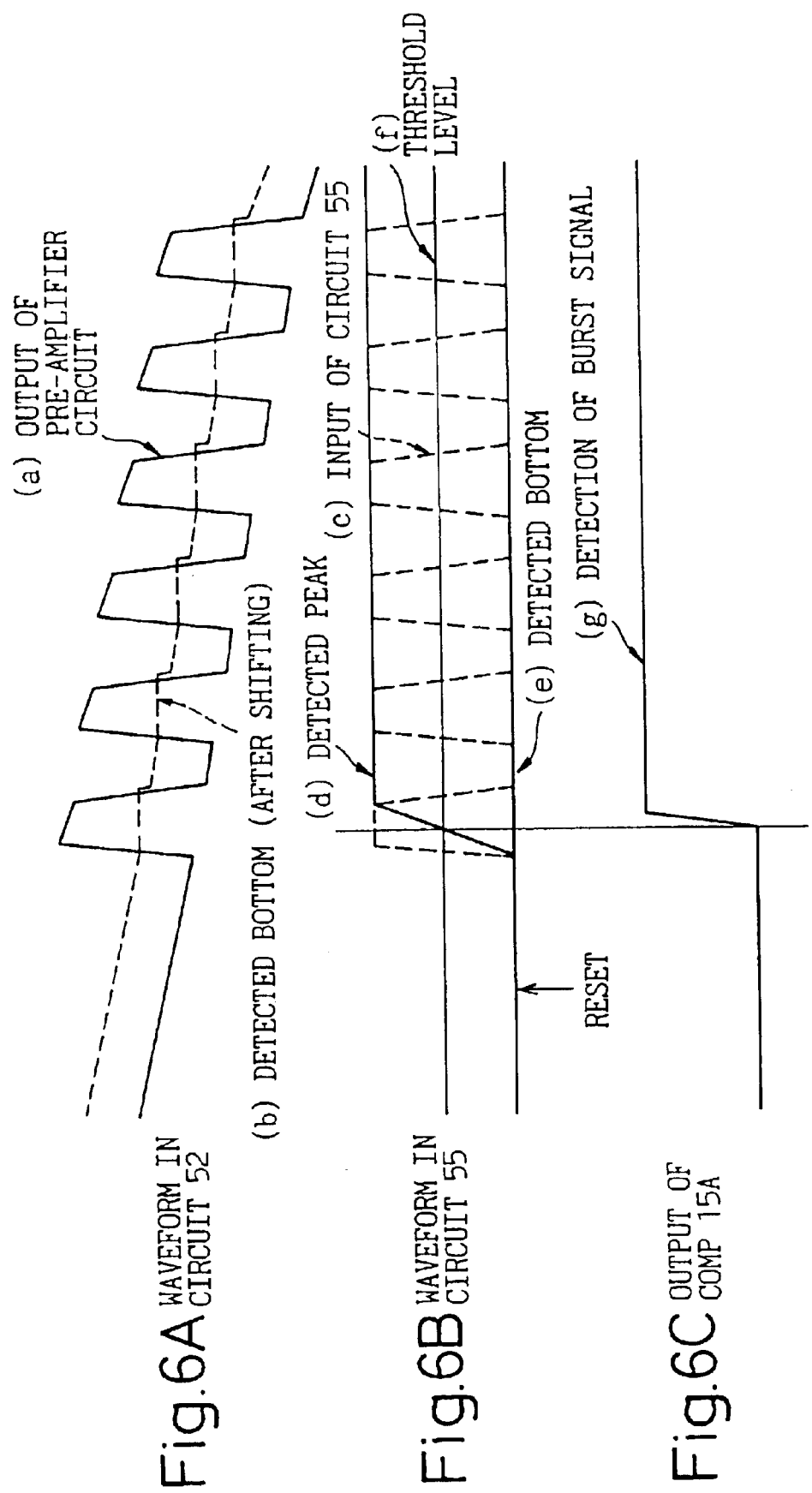
FIGS. 6A–6C are diagrams showing operating waveforms according to the third embodiment of the invention.

FIG. 5 shows a configuration of the third embodiment of the invention, and FIG. 6 shows operating waveforms thereof. In FIG. 5, like FIG. 1, a burst signal detection circuit of an optical burst signal receiver is shown. In this third embodiment, a level shift circuit 52C is added to the output of the bottom detection circuit 12A for detecting the DC level variation in the DC variation removing circuit 52.

If the level shift circuit 52C is not provided, the output of the differential amplifier 12B can assume only positive values, and therefore only one half region of the linear output range can be used so that the output level of the differential amplifier 12B is liable to be saturated and the waveform is liable to be distorted.

In contrast, by adding the level shift circuit 52C, the negative linear output range can also be used for the output of the differential amplifier 12B. Thus, the saturation of the output level can be prevented and the waveform distortion can be reduced.

Also, according to the third embodiment, the amplitude detection circuit 56 in the amplitude identifying circuit 55 includes the peak detection circuit 16A and a bottom detection circuit 56B for detecting both a peak level and a bottom level.

By means of the threshold level control circuit 57A providing a predetermined current and a resistor 57B, the threshold level in the amplitude identifying circuit 55 is generated by shifting a predetermined voltage from the bottom level detected by the bottom detection circuit 56B in the amplitude detection circuit 56.

In the first embodiment described above, since the amplitude detection circuit 16 detects the level of only one side (peak side), the output level is affected by the DC operating point of the differential amplifier 12B. In the third embodiment, in contrast, since the threshold level is generated by shifting to the bottom level, the amplitude component alone can be detected without being affected by the DC operating point.

FIGS. 6A to 6C show an example of the operating waveforms according to the third embodiment in which FIG. 6A shows a waveform of the output signal from the DC variation removing circuit 52; FIG. 6B shows a waveform in each circuit in the amplitude identifying circuit 55; and FIG. 6C shows a waveform of the comparator 15A in the amplitude identifying circuit 55.

The DC variation removing circuit 52 is supplied with a signal (a) indicated by solid line in FIG. 6A from the preamplifier 11. The bottom level detected by the bottom detection circuit 12A in the DC variation removing circuit 52 is shifted to the level (b) indicated by a dotted line in the vicinity of the center of the output signal level of the preamplifier 11 and is input to the differential amplifier 12B. Thus, the differential amplifier 12B outputs a signal assuming both negative and positive values with respect to a level to which the bottom level is shifted by a predetermined amount.

The amplitude identifying circuit 55, on the other hand, is supplied with a signal (c) indicated by a dotted line in FIG. 6B from the DC variation removing circuit 52, and the peak detection circuit 16A in the amplitude identifying circuit 55 outputs a detected peak level (d) indicated by a solid line in FIG. 6B.

The bottom detection circuit 56B in the amplitude identifying circuit 55 outputs a detected bottom level (e) indicated by a solid line in FIG. 6B. The bottom level is shifted by a predetermined amount by the threshold level control circuit 57A and the resistor 57B to a threshold level (f) indicated by a solid line in FIG. 6B. The threshold level (f) is input to the comparator 15A.

When the peak level (d) output from the peak detection circuit 16A in the amplitude detection circuit 56 exceeds the threshold level (f) (FIG. 6B), the comparator 15A outputs a detection signal (g) indicating the presence of the burst signal as shown in FIG. 6C.

Figure 7:
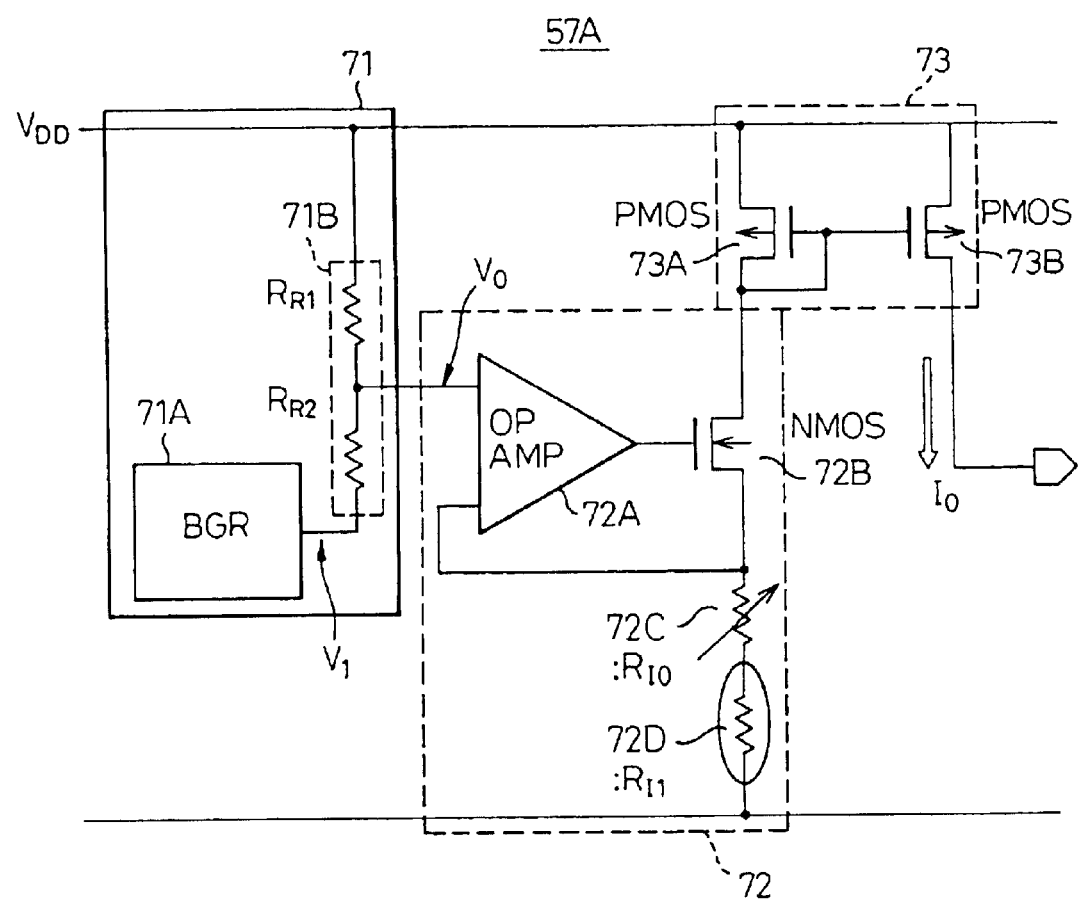
FIG. 7 is a diagram showing a configuration of the threshold level control circuit according to the third embodiment of the invention.

FIG. 7 shows an example configuration of the threshold level control circuit 57A according to the third embodiment of the invention. The threshold level control circuit 57A includes a reference voltage circuit 71, a current regulating circuit 72 and a current mirror circuit 73.

The reference voltage circuit 71 includes a reference voltage source (BGR) 71A, and a voltage dividing circuit 71B having resistors $R_{R1}$ and $R_{R2}$ of resistance values $R_{R1}$ and $R_{R2}$. The current regulating circuit 72 includes an operational amplifier 72A, an NMOS transistor 72B, a variable resistor 72C of resistance value $R_{f0}$, and a thermistor 72D of a resistance value $R_{f1}$. The current mirror circuit 73 includes two PMOS transistors 73A and 73B.

The threshold level control circuit 57A outputs a reference current $I_0$ from the current mirror circuit 73 based on the reference voltage output $V_O$ from the reference voltage circuit 71, and shifts the detected bottom level by the voltage drop $\Delta V_{REF}$ due to the reference current $I_0$ and the reference resistor 57B in the threshold level control circuit 57 shown in FIG. 5 to generated the threshold level $V_{REF}$.

Let $V_{BT}$ be the detected bottom level output from the bottom detection circuit 56B in the amplitude detection circuit in FIG. 5, $R_{REF}$ be the resistance value of the reference resistor 57B, $V_1$ be the output voltage of the reference voltage source (BGR) 71A in the reference voltage circuit 71 in FIG. 7, and $V_{DD}$ a supply voltage. The threshold level output $V_{REF}$ from the threshold level control circuit 57 is expressed by equation (2) below.

$$V_{REF}=V_{BT}+I_0*R_{REF}=V_{BT}+(V_O/(R_{I0}+R_{f1}))*R_{REF}=V_{BT}+\{(R_{R1}*V_1+R_{R2}*V_{DD})/(R_{R1}+R_{R2})\}*\{R_{REF}/(R_{I0}+R_{f1})\} \quad (2)$$

The variable resistor 72C and the thermistor 72D of the resistance values $R_{I0}$ and $R_{f1}$, respectively, are resistors connected outside of the LSI. The variable resistor 72C is for current regulation and the thermistor 72D is a resistor for temperature compensation. In the case where the thermistor 72D (resistance value $R_{f1}$) has a positive temperature coefficient, the temperature coefficient of the threshold level is negative.

In this configuration example of the threshold level control circuit, the threshold level is compensated for the gain variation of the preamplifier 11 or the DC variation removing circuit 52 in accordance with the variation in power supply. As a result, the threshold level irregularity due to the gain variation for detecting the presence or absence of the burst signal can be reduced.

FIG. 8 shows a configuration of a fourth embodiment of the invention, and FIG. 9 shows operating waveforms thereof. In the fourth embodiment, instead of providing the DC variation removing circuit as an independent circuit, the function of removing the DC variation is built in a signal amplifier 83, and the output of the DC variation removing signal amplifier is input to an amplitude identifying circuit 85 to thereby simplify the circuit elements.

The DC variation removing signal amplifier 83 includes a bottom detection circuit 83A, an amplifier 84 and a limiter amplifier 83B. The amplifier 84 includes an amplifier 84A, a peak detection circuit 84B and resistors 84c, 84D, 84E, and 84F.

The amplitude identifying circuit 85 includes an amplitude detection circuit 86, a identifying circuit 87 and a comparator 85A. The amplitude detection circuit 86 includes a peak detection circuit 86A and a bottom detection circuit 86B. The identifying circuit 87 includes a threshold level control circuit 87A and resistors 87B, 87C.

FIGS. 9A to 9C show operating waveforms according to the fourth embodiment. FIG. 9A shows a waveform of the output signal from the DC variation removing signal amplifier 83, FIG. 9B a waveform in each circuit of the amplitude identifying circuit 85, and FIG. 9C a waveform of the comparator 85A in the amplitude identifying circuit 85.

To the DC variation removing signal amplifier 83, a signal (a) indicated by a dotted line in FIG. 9A is input, and the bottom detection circuit 83A in the DC variation removing signal amplifier 83 outputs a detected bottom level (b) indicated by a solid line in FIG. 9C.

The detected bottom level (c) is input to one input terminal of the amplifier 84A through a resistor 84D. To the input terminal, the peak level detected by the peak detection circuit 84B from the positive phase output of the amplifier 84A is also input. As a result, a level in the vicinity of the central portion of the received signal level is determined as a threshold level.

To the other input terminal of the amplifier 84A, the output signal from the preamplifier 11 and the negative phase output of the amplifier 84A through the resistors 84C and 84E are input. Thus, the amplifier 84A can output a voltage with either a positive or negative value with respect to the vicinity of the central portion of the received signal level, thereby outputting an amplified signal in which the DC variation has been removed.

The output signal of the DC variation removing signal amplifier 83 is input to the amplitude identifying circuit 85. This signal is indicated by a dotted line (c) in FIG. 9B. In the signal amplitude identifying circuit 85, the peak detection circuit 86A detects and outputs the peak level (d) of the input signal (c). The detected peak output (d) is input to one input terminal of the comparator 85B through the resistor 87B.

The bottom detection circuit 86B in the amplitude identifying circuit 85 detects and outputs the bottom level (e) of the input signal (c), and the detected bottom output (e) is input to the other input terminal of the comparator 85A through the resistor 87C.

Further, to the input terminals of the comparator 85A, a level shifting current is input from the threshold level control circuit 87A. The detected peak output (d) described above is shifted to an amplitude threshold level #1 indicated by (f) in FIG. 9B, while the detected bottom output (e) is shifted to an amplitude threshold level #2 indicated by (g) in FIG. 9B. When the amplitude threshold level #1 indicated by (f) exceeds the amplitude threshold level #2 of (g), the comparator 85A outputs the detection signal (h) indicating the presence of a burst signal as shown in FIG. 9C.

According to the fourth embodiment, a weak signal is amplified by the DC variation removing signal amplifier 83, and the amplitude thus increased is detected for amplitude identification. Thus, the presence or absence of the burst signal can be detected more accurately.

In this embodiment, the DC variation removing signal amplifier 83 constitutes an automatic threshold control (ATC) circuit of feedback type for feeding back the positive phase output of the amplifier 84A to the input side through the peak detection circuit 84B and the resistor 84F. At the same time, the negative phase output of the amplifier 84A is fed back to the input side through the resistor 84E. The amplifier inserted before the amplitude identifying circuit and having the function of removing the DC variation, however, is not necessarily limited to the above-mentioned amplifier but can be variously modified.

Figure 10A:
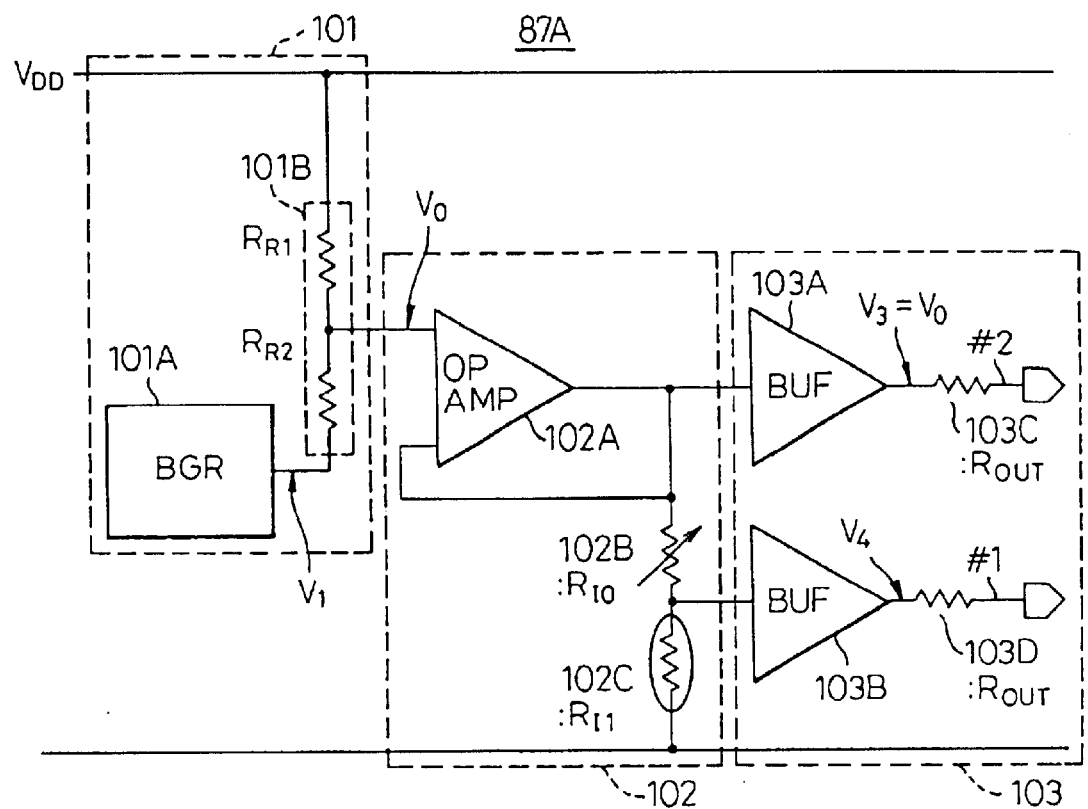
FIGS. 10A and 10B are diagrams showing a configuration of the threshold level control circuit according to the fourth embodiment of the invention.

FIG. 10A shows an example configuration of the threshold level control circuit 87A according to the fourth embodiment of the invention. As shown in FIG. 10A, the threshold level control circuit 87A includes a reference voltage circuit 10A, a current regulating circuit 102 and a current output circuit 103. The threshold level control circuit 87A is similar to the threshold level control circuit 57A in the third embodiment in that the gain variation is compensated by the threshold level.

The reference voltage circuit 101 includes a reference voltage source (BGR) 101A and a voltage dividing circuit including resistors with resistance values $R_{R1}$ and $R_{R2}$. The voltage regulating circuit 102 includes an operational amplifier 102A, a variable resistor 102B with a resistance value $R_{I0}$ and a thermistor 102C with a resistance value $R_{f1}$. The current output circuit 103, on the other hand, includes a buffer amplifier 103A for outputting an amplitude identifying signal #2, a resistor 103C with a resistance value ROUT, a buffer amplifier 103B for outputting an amplitude identifying signal #1 of lower level than the amplitude identifying signal #2, and a resistor 103D with a resistance value $R_{OUT}$.

The amplitude identifying signal #2 and the amplitude identifying signal #1 output from the threshold level control circuit 87A are input to the comparator 85A in FIG. 8 together with the output of the peak detection circuit 86A and the bottom detection circuit 86B.

Thus, the comparator 85A is supplied with the peak level $V_{PK}$ detected by the peak detection circuit 86A, the bottom level $V_{BT}$ detected by the bottom detection circuit 86B, and the amplitude level #1 ($V_{REF1}$) of the signal (f) and the amplitude level #2 ($V_{REF2}$) of the signal (g) obtained by dividing the output voltages $V_3$ and $V_4$ of the buffer amplifiers 103A and 103B connected to the output of the threshold level control circuit 87A shown in FIG. 10A. The input levels are compared with each other by the comparator 85A.

The amplitude levels $V_{REF1}$ and $V_{REF2}$ and the difference thereof $V_{REF1}-V_{REF2}$ are expressed by the equations below.

$$V_{REF1}=(R_{OUT}*V_{PK}+R_{REF}*V_3)/(R_{OUT}+R_{REF})=$$
$$R_{OUT}*V_{PK}/(R_{OUT}+R_{REF})+\{R_{RIF}/(R_{OUT}+R_{REF})\}*\{$$
$$(R_{R1}*V_1+R_{R2}*V_{DD})/(R_{R1}+R_{R2}) \quad (3\text{-}1)$$

$$V_{REF2}=(R_{OUT}*V_{BT}+R_{REF}*V_4)/(R_{OUT}+R_{REF})=$$
$$R_{OUT}*V_{ST}/(R_{OUT}+R_{REF})+\{R_{REF}/(R_{OUT}+R_{REF})\}*\{$$
$$R_{f1}/(R_{f0}+R_{f1})\}*\{(R_{f1}*V_1+R_{R2}*V$$
$$DD)/(R_{R1}+R_{R2})\} \quad (3\text{-}2)$$

$$V_{REF1}-V_{REF2}=\{R_{OUT}/(R_{OUT}+R_{REF})\}*(V_{PK}-V_{BT})-$$
$$\{R_{REF}/(R_{OUT}+R_{REF})\}*\{R_{f0}/(R_{f0}+R_{f1})\}*\{$$
$$(R_{R1}*V_1+R_{R2}*V_{DD})/(R_{R1}+R_{R2})\}=$$
$$\{R_{OUT}/(R_{OUT}+R_{REF})\}*(V_{PK}-V_{BT})-\Delta V_{REF} \quad (3\text{---}3)$$

Figure 10B:
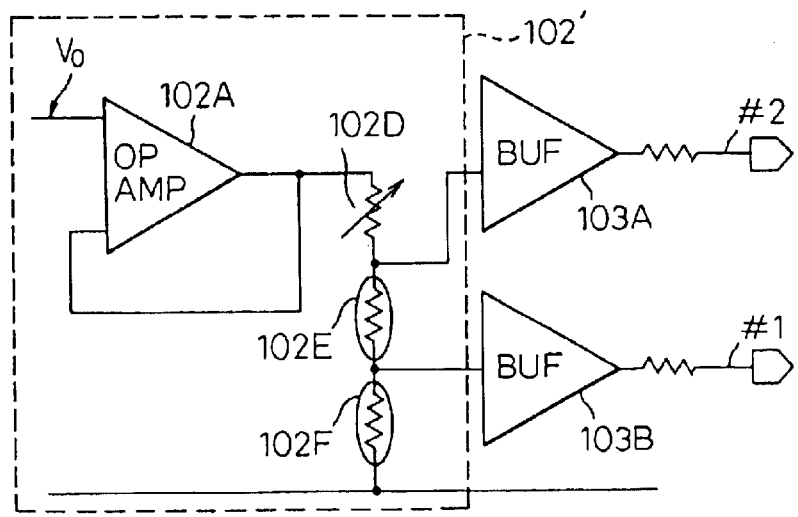

In the threshold level control circuit according to the third embodiment shown in FIG. 7, as seen from equation (2), is such that the threshold level $V_{REF}$ depends on the ratio between the resistors $R_{f0}$ and $R_{f1}$ which are provided in an external area of the LSI and the internal resistor $R_{REF}$ of the LSI. This resistance changes with the temperature difference between the interior and exterior, thereby changing the threshold level according to the temperature of the operating environment. In the case where the threshold level control circuit shown in FIGS. 10A, 10B is used, on the other hand, the voltage input to the comparator, as seen from equation (3—3), constitutes the term of the resistance ratio between the internal resistors or between the external resistors. Thus, a high-accuracy threshold level control, which is stable against the temperature difference between the exterior and interior or the change thereof, is possible.

In place of the voltage regulating circuit 102, as shown in FIG. 10B, a voltage regulating circuit 102' including an operational amplifier 102A, a variable resistor 102D and two thermistors 102E and 102F can be used. In such a case, both the amplitude identifying signal #1 and the amplitude identifying signal #2 can be temperature-compensated thereby to make possible a more accurate temperature compensation.

FIG. 11 shows a configuration according to a fifth embodiment of the present invention. FIG. 12 shows operating waveforms of this embodiment. In the fifth embodiment, a master-slave type automatic threshold control (ATC) circuit is used as a DC variation removing circuit. The other parts of the configuration are similar to those of the third embodiment shown in FIG. 5, and will not be described again.

In the aforementioned DC variation removing circuit using the bottom detection circuit and the differential amplifier, the DC variation detection signal output from the bottom detection circuit is not at the central level of the input signal. In the case where the gain of the differential amplifier is increased, therefore, the problem is posed that the high-level ("1") side of the output signal is saturated, thereby deteriorating the pulse width.

The master-slave type automatic threshold control (ATC) circuit 112 in the DC variation removing signal amplifier 111 according to the embodiment shown in FIG. 11, on the other hand, includes a peak detection circuit 112A, a bottom detection circuit 112B and a voltage dividing circuit 112C, and the peak detection circuit 112A is configured to detect the relative maximum level from the bottom detection level and output a detected peak level.

Also, the central level between the bottom detection level and the detected peak level, determined by the voltage dividing circuit 112C, is set as a threshold signal of the differential amplifier 12B. Therefore, while the threshold signal follows the DC variation, it can be set at the central level of the input signal, thereby preventing the deterioration of the pulse width even with an increased gain of the differential amplifier 12B.

FIGS. 12A to 12C show an example of operating waveforms, according to the fifth embodiment shown in FIG. 11, in which FIG. 12A shows waveforms in the DC variation removing signal amplifier 111, FIG. 12B shows waveforms in the peak detection circuit 16A, the bottom detection circuit 56B and the threshold level control circuit 57A in the amplitude identifying circuit 55, and FIG. 12C shows a waveform of the output signal from the comparator 15A in the amplitude identifying circuit 55.

To the DC variation removing signal amplifier 111, a signal (a) indicated by a dotted line in FIG. 12A is supplied from the preamplifier 11. The bottom detection circuit 112B in the DC variation removing signal amplifier 111 detects and outputs the bottom level (c).

The peak detection circuit 112A detects and outputs the relative peak level (b) from the bottom level (c), and the voltage dividing circuit 112C outputs the peak level (b) and the central level (d) of the bottom level (c) as an output signal of the automatic threshold control (ATC) circuit 112.

Also, to the amplitude identifying circuit 55, the signal (e) indicated by a dotted line in FIG. 12B is supplied from the DC variation removing signal amplifier 111. The peak detection circuit 16A in the amplitude identifying circuit 55 outputs the detected peak level (f) shown in FIG. 12B.

The bottom detection circuit 56B in the amplitude identifying circuit 55 outputs the detected bottom level (g) shown in FIG. 12B, and the threshold level (h) in FIG. 12B obtained by shifting the bottom level (g) by a predetermined amount by the threshold level control circuit 57A and the resistor 57B is input to the comparator 15A.

Once the peak level (f) output from the peak detection circuit 16A in the amplitude detection circuit 56 exceeds the threshold level (h), the comparator 15A outputs the detection signal (i) indicating the presence of a burst signal as shown in FIG. 2C.

FIG. 13 shows an example configuration of the master-slave automatic threshold control (ATC) circuit according to the fifth embodiment of the invention. The master bottom detection circuit 112B includes an amplifier 132A, a buffer amplifier 132B, a diode 132C and a capacitor 132D for detecting the absolute minimum level.

The slave peak detection circuit 112A includes an amplifier 131A, a buffer amplifier 131B, a diode 131C and a capacitor 131D. Also, the output of the master bottom detection circuit 112B is connected to an end of the capacitor 131D thereby to detect the relative maximum level from the detected bottom level.

According to the fifth embodiment, the DC level variation due to the low frequency response of the photodiode (PD) is first detected by the master bottom detection circuit 112B, and the output of the slave peak detection circuit 12A is followed by the detected bottom level, and these signals are divided by the voltage dividing circuit 112C. While the threshold level generated in the automatic threshold control (ATC) circuit follows the DC level variation, it can be set to the center of the amplitude of the input signal.

Figure 14:
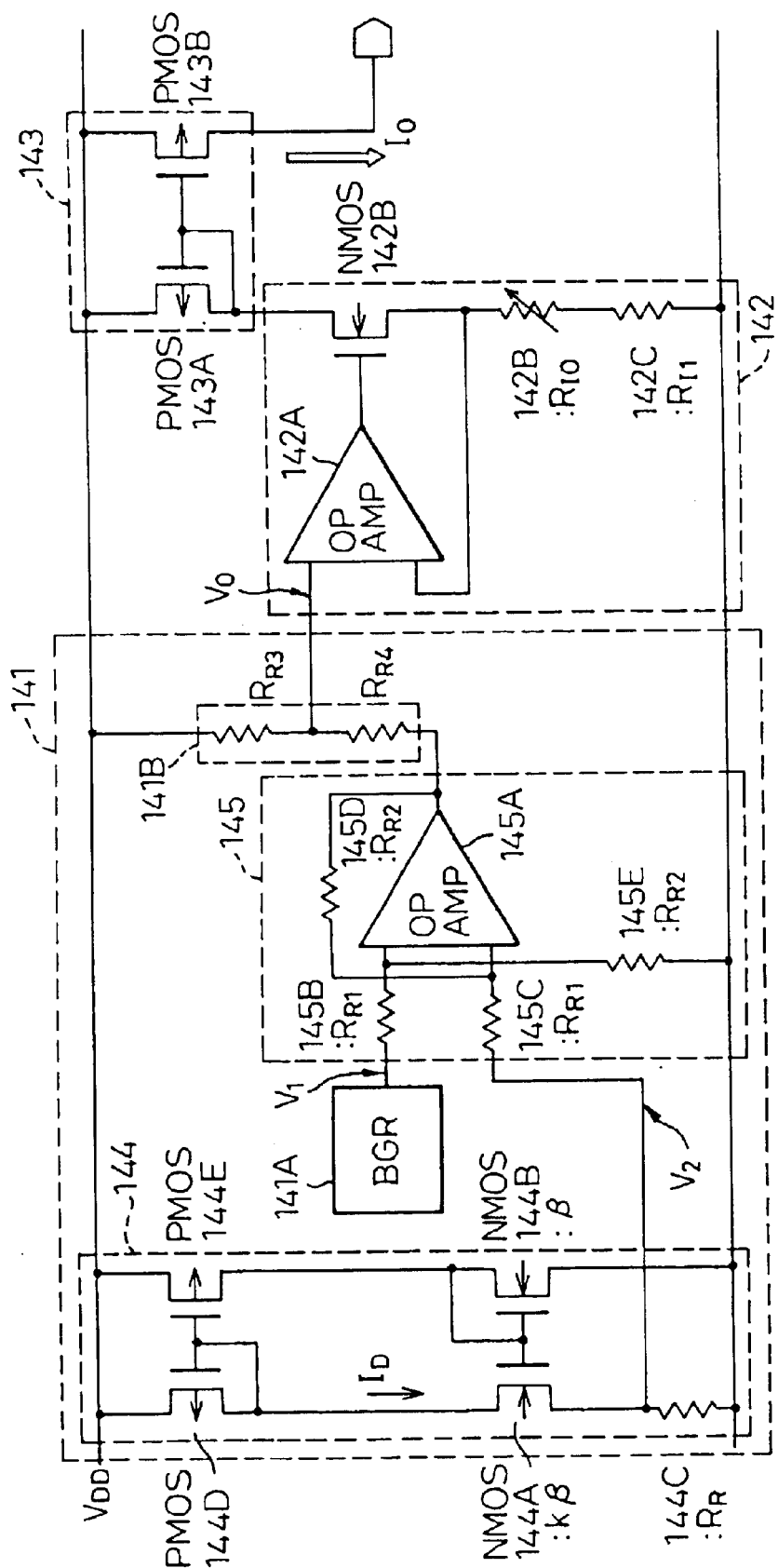
FIG. 14 is a diagram showing a configuration of the threshold level control circuit according to the fifth embodiment of the invention.

FIG. 14 shows an example configuration of the threshold level control circuit according to the fifth embodiment. This threshold level control circuit includes a reference voltage circuit 141 having a temperature reference voltage circuit 144, a reference voltage source (BGR) 141A, an amplifier 145 and a voltage dividing circuit 141B, a voltage regulating circuit 142 and a current mirror circuit 143.

The threshold level control circuit is similar to the threshold level control circuit according to the third embodiment described above in that a reference current $I_0$ is output from the current mirror circuit 143 in the last stage, and the detected bottom level is shifted to provide a threshold level.

The threshold level control circuit shown in FIG. 14 utilizes the temperature reference voltage circuit 144 with a field effect transistor (FET) in the LSI but not an external thermistor in order to give a temperature inclination of the threshold level. As a result, the external parts can be reduced and a simplified configuration is obtained.

The threshold level $V_{REF}$ applied to the comparator 15A is expressed by equations (4-1) and (4-2) below, where the temperature inclination is given by the term of $V_2$ in equation (4-2) and the supply voltage inclination by the term of $V_{DD}$.

$$V_{REF}=V_{BT}+I_0*R_{REF}=V_{BT}+\{V_0/(R_{f0}+R_{f1})\}*R_{REF} \quad (4\text{-}1)$$

$$V_0=\{R_{R4}/(R_{R3}+R_{R4})\}*(R_{R2}/R_{R1})*V_1-\{R_{R4}/(R_{R3}+R_{R4})\}*(R_{R2}/R_{R1})*V_2+\{R_{R3}/(R_{R3}+R_{R4})\}*V_{DD} \quad (4\text{-}2)$$

where $V_0$ is the output voltage of the reference voltage circuit 141, $V_1$ is the output voltage of the reference voltage source (BGR) 141A, $V_2$ is the temperature reference voltage obtained from the temperature reference voltage circuit 144 and $V_{DD}$ is the supply voltage.

The temperature reference voltage $V_2$ is expressed in a form inversely proportional to the gain coefficient β of the MOS-FET as shown in equation (5) below. The temperature coefficient of the gain coefficient β of the MOS-FET is negative and therefore the temperature coefficient of the value of the temperature reference voltage $V_2$ is positive.

$$V_2=(1/R)*(2/\beta)*\{1-\sqrt{(1/k)}\} \quad (5)$$

FIG. 15 shows a configuration according to a sixth embodiment of the invention, and FIG. 16 shows the operating waveforms thereof. According to the sixth embodiment, the input signal is amplified by a differential amplifier 12B in a DC variation removing signal amplifier 151, after which the resulting signal is further amplified by an amplifier 153 and applied to an amplitude identifying circuit 155. As a result, a weak input signal is amplified and the amplitude thus increased is identified, so that the presence or absence of a burst signal can be surely detected.

Also, in the automatic threshold control (ATC) circuit 152 in the DC variation removing signal amplifier 151, the input signal level and the bottom level output from the bottom detection circuit 152B are divided by the voltage dividing circuit 152C thereby to produce a voltage divided signal, which is applied to a peak detection circuit 152A and the peak detection output thereof is set as a threshold signal. In this way, the amplifier inserted before amplitude identification can be variously configured.

Also according to this embodiment, the output of the comparator 15A is positively fed back to the input thereof through a resistor 155A, and the output of the peak detection circuit 16A is input to the comparator 15A through a resistor 155B thereby to set a hysteresis. By thus setting a hysteresis, even in the case where the output signal of the amplitude detection circuit 56 is weak and is liable to be affected by noises, the effect of the noises can be removed and the presence or absence of the burst signal can be positively detected.

FIGS. 16A to 16C show an example of the operating waveforms according to the sixth embodiment shown in FIG. 15. FIG. 16A shows a waveform of the DC variation removing signal amplifier 151, FIG. 16B waveforms of the peak detection circuit 16A, the bottom detection circuit 56B and the threshold level control circuit 57A in the amplitude identifying circuit 155, and FIG. 16C a waveform of the comparator 15A in the amplitude identifying circuit 155.

The DC variation removing signal amplifier 151 is impressed with the signal (a) indicated by dotted line in FIG. 16A from the preamplifier 11, and the bottom detection circuit 152B in the DC variation removing signal amplifier 151 detects and outputs the bottom level (c).

To the peak detection circuit 152A, the voltage divided level (b) between the bottom level (c) and the input signal (a) is supplied. The peak level is output as an output (d) of the automatic threshold control (ATC) circuit. The waveforms of FIGS. 16B, 16C are similar to those of FIGS. 12B, 12C and therefore will not be described again.

Figure 17:
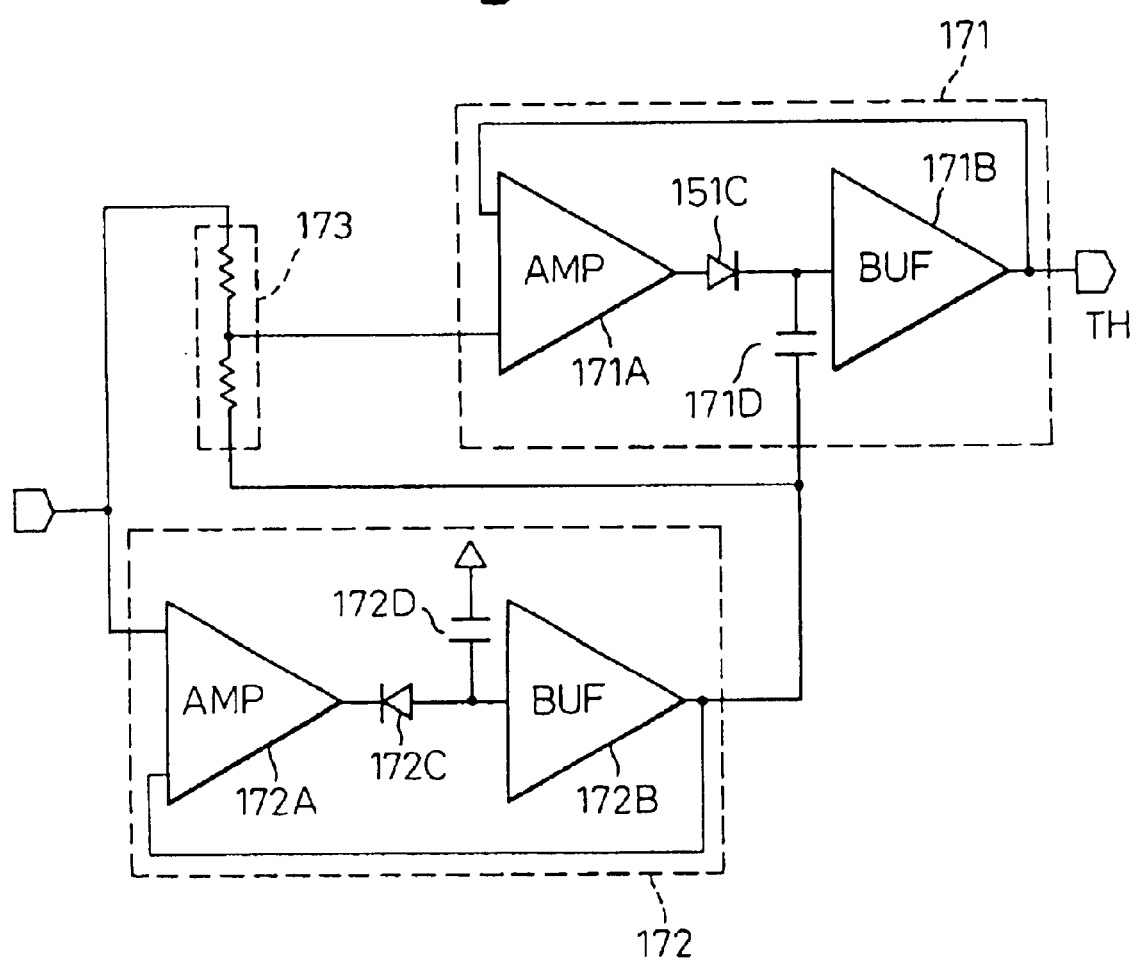
FIG. 17 is a diagram showing a configuration of the master-slave type automatic threshold control (ATC) circuit according to the sixth embodiment of the invention.

FIG. 17 shows an example configuration of the master-slave type automatic threshold control (ATC) circuit according to a sixth embodiment. A master bottom detection circuit 172 detects the absolute minimum level, and a voltage dividing circuit 173 generates a voltage division level which is half way between the bottom detection level and the input signal level.

One terminal of a peak hold capacitor 171D in the slave peak detection circuit 171 is connected to the output of the master bottom detection circuit 172, and therefore the central level of amplitude is detected as a relative peak level from the detected bottom level.

Figure 18:
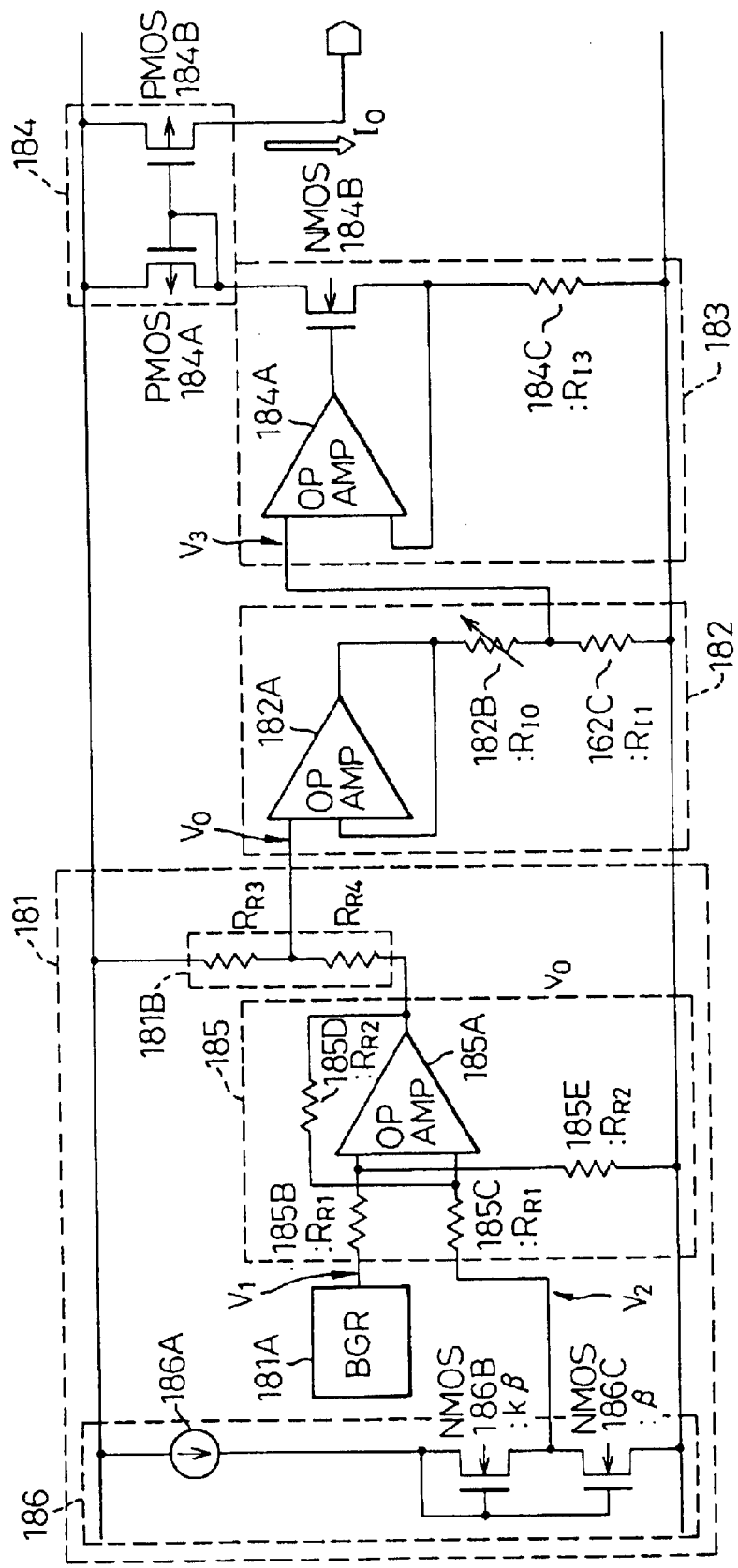
FIG. 18 is a diagram showing a configuration of the threshold level control circuit according to the sixth embodiment of the invention.

FIG. 18 shows an example configuration of the threshold level control circuit according to the sixth embodiment. This configuration example includes a reference voltage circuit 181 having a temperature reference voltage circuit 186, a reference voltage source (BGR) 181A, a differential amplifier 185 and a voltage dividing circuit 181B, a voltage regulating circuit 182, a current source circuit 183 and a current mirror circuit 184. In this embodiment, a temperature reference voltage $V_2$ is generated due to the internal FET with a configuration simple as compared with the example configuration of the threshold level control circuit according to the embodiment shown in FIG. 14.

In this configuration example of the threshold level control circuit, the threshold level $V_{REF}$ is expressed by equation (6) below, and similar to the configuration of the threshold level control circuit according to the fourth and fifth embodiments, the threshold level is determined by voltage division between the internal resistors or between the external resistors. Thus the threshold level regulation with high accuracy is possible.

$$V_{REF}=V_{BT}+I_0*R_{REF}=V_{BT}+\{R_{f1}/(R_{f0}+R_{f1})\}*(V_0/R_{f3})*R_{REF} \quad (6)$$

The temperature reference voltage $V_2$, as shown in equation (7) below, is expressed in a form inversely proportional to the square root of the gain coefficient β of the MOS.

$$V_2 = \{1 - \sqrt{(1/k)}\} * \sqrt{(2*I_0/\beta)} \qquad (7)$$

Figure 19:
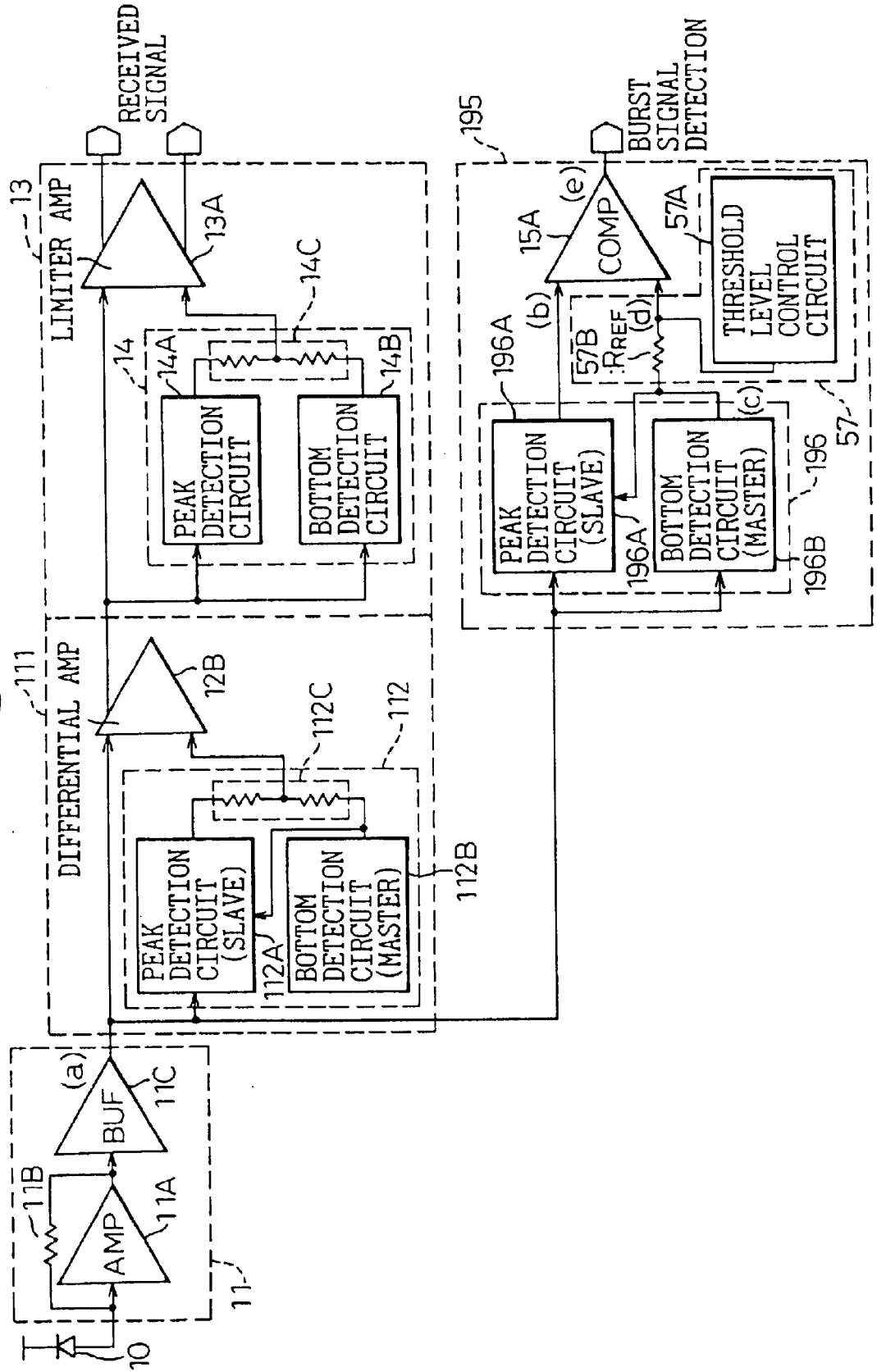
FIG. 19 is a diagram showing a configuration according to a seventh embodiment of the invention.
Figure 20:
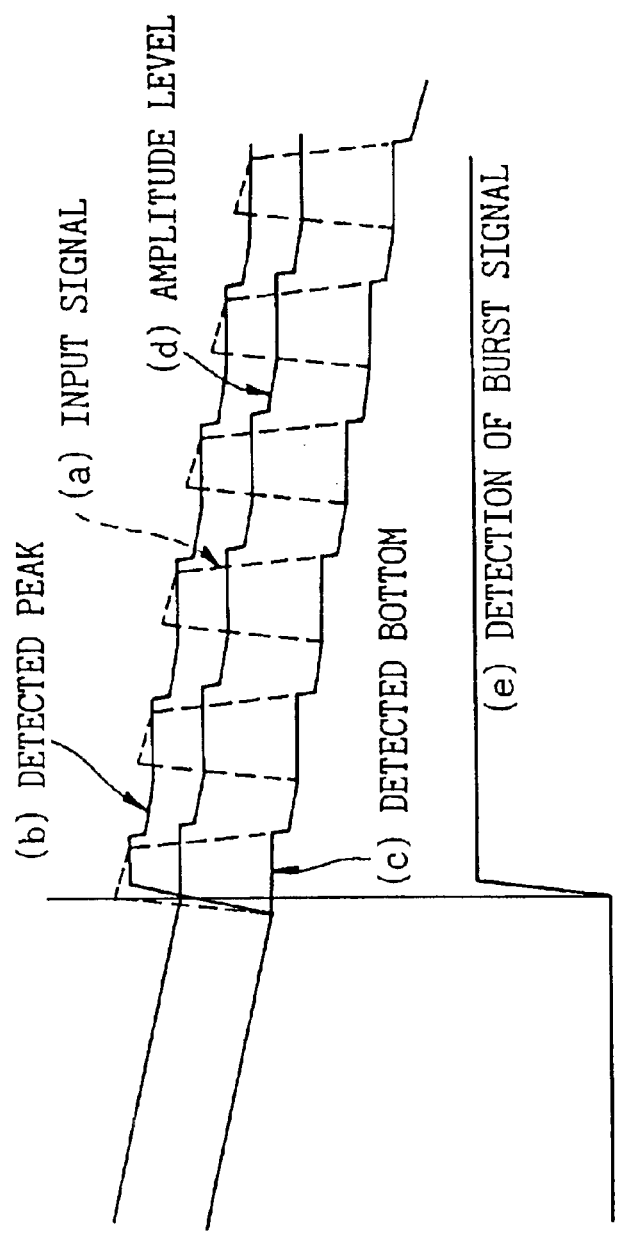
FIGS. 20A and 20B are diagrams showing operating waveforms according to the seventh embodiment of the invention.
Figure 21:
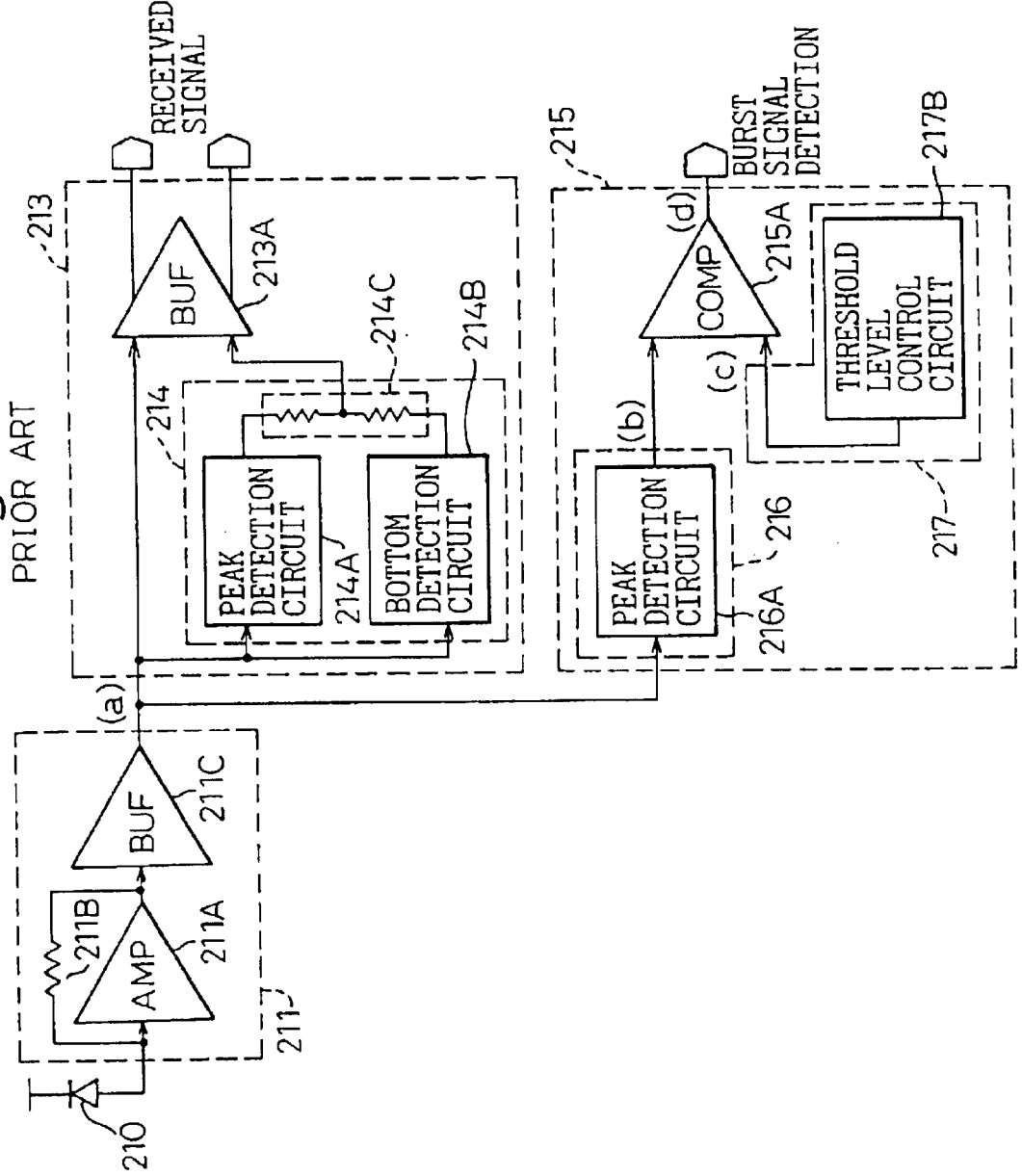
FIG. 21 is a diagram for explaining the conventional burst signal detection circuit.

FIG. 19 shows a configuration according to a seventh embodiment of the invention, and FIG. 20 the operating waveforms thereof. According to the seventh embodiment, a peak detection circuit 196A and a bottom detection circuit 196B of master-slave type are used as an amplitude detection circuit 196 in an amplitude identifying circuit 195, and the DC level variation is removed by the amplitude detection circuit 196.

The master-slave type peak detection circuit 196A and the bottom detection circuit 196B can be configured the same way as the circuits shown in FIGS. 13 and 17. Also, this configuration is similar to the configuration example of FIG. 11 except that the input signal of the amplitude identifying circuit 195 makes up an output signal of the preamplifier 11. Therefore, the same component elements are designated by the same reference numerals, respectively, and will not be described.

FIGS. 20A and 20B show operating waveforms according to the seventh embodiment, in which FIG. 20A shows a waveform in each circuit of the amplitude identifying circuit 195 and FIG. 20B a waveform of the output signal from the comparator 15A of the output signal from the amplitude identifying circuit 195.

To the amplitude identifying circuit 195, an input signal (a) indicated by a dotted line in FIG. 20A is supplied from the preamplifier 11. The master bottom detection circuit 196B outputs the detected bottom level (c), and the peak detection circuit 196A detects and outputs the relative peak level (b) with respect to the detected bottom level (c).

The detected bottom level (c) is shifted by a predetermined amount by the threshold level control circuit 57A to the threshold level (d) which is input to the comparator 15A. The comparator 15A compares the threshold level (d) with the peak level (b), and in the case where the peak level (b) exceeds the threshold level (d), outputs a detection signal (e) indicating the presence of a burst signal.

It will thus be understood from the foregoing description that, according to the present invention, a DC variation removing circuit is inserted before amplitude detection of the input signal, so that the amplitude is identified after removing the DC level variation. Thus, regardless of the DC level variation of the input signal, the presence or absence of a burst signal can be detected with high accuracy, and the erroneous detection of the burst signal which otherwise might be caused by the signal level variation due to the low frequency response of the photo-diode (PD) can be prevented. In this way, the presence or absence of the burst signal can be accurately detected even for a weak input signal.

What is claimed is:

1. A burst signal detection circuit comprising:

a DC variation removing circuit detecting the bottom level of an input signal when an input signal level is falling, and removing the DC level variation of the input signal by differentially amplifying the difference between the input signal level and detected bottom level of the input signal; and an amplitude identifying circuit detecting the presence or absence of a burst signal in said input signal based on the output signal from the DC variation removing circuit;

said amplitude identifying circuit including:

an amplitude detection circuit detecting the maximum amplitude of the output signal of said DC variation removing circuit;

a threshold level control circuit controlling a threshold; and a comparator circuit comparing the output level of said amplitude detection circuit with said threshold level and outputting a detection signal indicating the presence or absence of the burst signal.

2. The burst signal detection circuit according to claim 1, wherein said DC variation removing circuit includes:

a bottom detection circuit detecting the bottom level of the input signal when the input signal level is falling, and a differential amplifier differentially amplifying the difference between the input signal and the output signal from said bottom detection circuit.

3. The burst signal detection circuit according to claim 1, wherein said threshold level control circuit includes a reference voltage circuit changing said threshold level with the supply voltage change, said reference voltage circuit being so configured as to compensate for the variation of the gain due to the supply voltage change.

4. The burst signal detection circuit according to claim 1, further comprising a photodiode receiving an optical signal and a preamplifier converting the current signal from said photodiode into a voltage signal, wherein the arrival of a burst signal is detected from the output signal of said preamplifier.

5. A burst signal detection circuit comprising:

a DC variation removing signal amplifier detecting the bottom level of an input signal when the input signal level is falling, removing the DC level variation of the input signal based on the detected bottom level, and amplifying said input signal; and an amplitude identifying circuit detecting the presence or absence of a burst signal in said input signal based on the output signal from the DC variation removing signal amplifier;

said amplitude identifying circuit including:

an amplitude detection circuit detecting the maximum amplitude of the output signal of said DC variation removing amplifier;

a threshold level control circuit controlling the threshold level; and a comparator circuit comparing the output level of said amplitude detection circuit with said threshold level and outputting a detection signal indicating the presence or absence of the burst signal.

6. The burst signal detection circuit according to claim 5, wherein said threshold level control circuit includes a reference voltage circuit changing said threshold level with the supply voltage change, said reference voltage circuit being so configured as to compensate for the variation of the gain due to the supply voltage change.

7. The burst signal detection circuit according to claim 5, further comprising a photodiode receiving an optical signal and a preamplifier converting the current signal from said photodiode into a voltage signal, wherein the arrival of a burst signal is detected from the output signal of said preamplifier.

* * * * *